(12) United States Patent
Fujimura et al.

(10) Patent No.: US 7,455,896 B2
(45) Date of Patent: Nov. 25, 2008

(54) ELECTRONIC COMPONENT CONTAINER

(75) Inventors: Tetsuo Fujimura, Gunma (JP); Takeshi Miyakawa, Gunma (JP); Mikio Shimizu, Gunma (JP); Satoshi Yokoyama, Gunma (JP); Masanori Higano, Gunma (JP); Masanori Ishii, Gunma (JP); Kazuhiro Kosugi, Gunma (JP); Takashi Tomizawa, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 84 days.

(21) Appl. No.: 10/296,937

(22) PCT Filed: May 27, 2002

(86) PCT No.: PCT/JP02/05121

§ 371 (c)(1),
(2), (4) Date: Dec. 10, 2002

(87) PCT Pub. No.: WO02/096773

PCT Pub. Date: Dec. 5, 2002

(65) Prior Publication Data

US 2003/0183553 A1  Oct. 2, 2003

(30) Foreign Application Priority Data

| May 28, 2001 | (JP) | ............................ 2001-158455 |
| Jul. 9, 2001 | (JP) | ............................ 2001-207442 |
| Oct. 16, 2001 | (JP) | ............................ 2001-317981 |
| Mar. 20, 2002 | (JP) | ............................ 2002-91019 |

(51) Int. Cl.
B65D 85/00 (2006.01)
B65D 1/34 (2006.01)

(52) U.S. Cl. .................. 428/35.7; 428/34.1; 428/36.92; 428/76; 206/710; 206/713; 206/714; 206/719

(58) Field of Classification Search ................. 206/701, 206/706, 710, 713, 714, 719; 428/34.1, 35.7, 428/36.92, 343
See application file for complete search history.

(56) References Cited

U.S. PATENT DOCUMENTS 5,648,136 A * 7/1997 Bird ............................ 428/76

(Continued)

FOREIGN PATENT DOCUMENTS

JP  61-217370  9/1986

(Continued)

OTHER PUBLICATIONS

U.S. Appl. No. 10/296,937, filed Dec. 10, 2002, Fujimura et al.

(Continued)

Primary Examiner—Rena L. Dye
Assistant Examiner—Walter B Aughenbaugh
(74) Attorney, Agent, or Firm—Oblon, Spivak, McClelland, Maier & Neustadt, P.C.

(57) ABSTRACT

A carrier tape body having an embossed tape continuously having pockets which contain an electronic component sealed with a cover tape, where the cover tape has a peeling static electrification amount of from −9 to +9 nC when the cover tape has a surface resistivity of at least $10^{11}$ Ω, and where the cover tape has a peeling static electrification amount of from −3 to +3 nC when the cover tape has a surface resistivity of less than $10^{11}$ Ω.

9 Claims, 3 Drawing Sheets

U.S. PATENT DOCUMENTS 6,246,113 B1 * 6/2001 Lin .......................... 257/692
6,312,566 B1 * 11/2001 Iwaisaki et al. ............. 204/165

FOREIGN PATENT DOCUMENTS

| | | |
|---|---|---|
| JP | 3-37258 | 2/1991 |
| JP | 3-87098 | 4/1991 |
| JP | 2-74570 | 3/1992 |
| JP | 04-0367457 | 12/1992 |
| JP | 4-93772 | 7/1994 |
| JP | 3001281 | 8/1994 |
| JP | 7-21834 | 1/1995 |
| JP | 07-0132963 | 5/1995 |
| JP | 8-72213 | 3/1996 |
| JP | 08-134416 | 5/1996 |
| JP | 09-0012083 | 1/1997 |
| JP | 9-142569 | 6/1997 |
| JP | 09-194806 | 7/1997 |
| JP | 09-272565 | 10/1997 |
| JP | 2798727 | 7/1998 |
| JP | 11-1589 | 1/1999 |
| JP | 2000-001555 | 1/2000 |
| JP | 2000-109582 | 4/2000 |
| JP | 2001-19033 | 1/2001 |
| JP | 2001-47564 | 2/2001 |
| JP | 2001-171727 | 6/2001 |
| JP | 2001-179870 | 7/2001 |
| JP | 2001-519728 | 10/2001 |
| JP | 2002-2867 | 1/2002 |
| JP | 2002-2870 | 1/2002 |
| JP | 2002-12288 | 1/2002 |
| JP | 2002-68281 | 3/2002 |
| JP | 2002-173194 | 6/2002 |
| JP | 2003-508253 | 3/2003 |

OTHER PUBLICATIONS

U.S. Appl. No. 10/495,656, filed May 17, 2004, Miyakawa et al.
Japanese Office Action dated Nov. 28, 2005, in Japanese Application No. 2001-317981 (w/English Translation).
Decision of Refusal dated Sep. 6, 2005, in Japanese Application No. 2001-158455 (w/English Translation).
Japanese Office Action dated Sep. 12, 2007 in corresponding application No. 2002-091019.

* cited by examiner

ELECTRONIC COMPONENT CONTAINER

TECHNICAL FIELD

The present invention relates to a container for an electronic component, particularly a carrier tape.

BACKGROUND ART

As a container for an electronic component such as an IC, a diode, a liquid crystal or a capacitor, a magazine, an embossed carrier tape (hereinafter sometimes referred to as a carrier tape), a tray, a bag, a container, a form, etc. may be mentioned. Such a container is used for e.g. containment, storage or transport of electronic components. With respect to an embossed carrier tape for example, an electronic component is contained in a pocket of an embossed tape and sealed and lidded with a cover tape to be in a form of a carrier tape body. When an electronic component is attached to a substrate, the cover tape is peeled off and the electronic component is taken out for use. Among electronic components, an IC comprises an integrated circuit called chip sealed with e.g. an epoxy resin. The IC is easily electrified with static electricity. Static electricity destroys the integrated circuit in the worst case. The static electricity is generated by shake (rubbing) when a packaged electronic component is transported, and it is generated when a cover tape is peeled off in the case of a carrier tape.

Such a container has electrical conductivity in general, so as to remove static electricity generated by contact or rubbing between the electronic component and the container, and to uniformly disperse the generated charge into the container so that a potential difference is less likely to generate. In order to impart electrical conductivity to the container for an electronic component, a metal material having electrical conductivity or a resin having carbon fibers or carbon black kneaded therewith is used. An electrical conductive coating containing e.g. carbon black may be coated on the surface of the container to impart electrical conductivity in some cases. Such a container has electrical conductivity, whereby the static electricity is likely to go away by earthing. However, impairment due to static electricity can not completely be prevented. As wiring in the electronic component becomes fine along with high integration of the electronic component, the electronic component is more likely to be influenced by static electricity.

Static electricity may cause other problems. The electronic component may be attached to the container by static electricity and it may be difficult to take it out in some cases. When a cover tape as a covering material of a carrier tape is peeled off to take out the electronic component, the electronic component is attached to the cover tape by static electricity and pop out from the carrier tape in some cases. Such a trouble causes decrease in workability at the time of mounting electronic components.

DISCLOSURE OF THE INVENTION

A container for an electronic component is made to have electrical conductivity to destaticize static electricity to protect the electrical component from impairment due to static electricity. However, "probability of generation" of static electricity derived from the container for an electronic component itself is not considered at all. Static electricity is generated by rubbing between an electronic component such as an IC and the container. With respect to the carrier tape body, static electricity is generated only by peeling a cover tape from an embossed tape. Even when the container has electrical conductivity, static electricity is generated. The molding compound on the surface of the IC is not electrically conductive, and accordingly the generated charge can not completely be removed even by earthing of the container for an electronic component. According to measurement by the present inventors, it was confirmed that even when an IC is contained in a container for an electronic component having electrical conductivity in an insulated state, when the container is shaken, the static electrification voltage on the surface of the IC exceeds 10,000V or 20,000V in some cases. The static electricity charged on the surface of the IC is sufficient to destroy the IC. The electronic component is contained in an electrically conductive container and transported. The electrical component is shaken in the container, static electricity is generated, the container is not earthed during transport, and the static electrification voltage of the generated static electricity increases.

With respect to a carrier tape body, generation of static electricity when a cover tape is peeled off from a carrier tape has to be prevented. The carrier tape body comprises an electronic component contained in an embossed tape, lidded with a cover tape. In order to prevent impairment due to static electricity, the peeling static electrification amount of the cover tape when the cover tape is peeled off should be from −9 to +9 nC with respect to a cover tape having a surface resistivity of at least $10^{11}$ Ω, and it should be from −3 to +3 nC with respect to a cover tape having a surface resistivity of less than $10^{11}$ Ω.

A material which is less likely to generate static electricity should be used for the surface of a container to be in contact with the electronic component. With respect to the carrier tape body, generation of static electricity when the cover tape is peeled off from the embossed tape can be suppressed when a side of the cover tape which faces the electronic component has a composition containing a resin at the positive polarity side and a resin at the negative polarity side relative to a side of the electronic component which faces the cover tape of the electronic component, in the series of frictional electrification.

It is also possible to employ a material which is close to a molding compound for the electronic component in the series of frictional electrification, for the surface of the packaging container to be in contact with the electronic component. Otherwise, a positive polarity side one and a negative polarity side one in the series of frictional electrification may be used together. For example, a vinylidene fluoride polymer and an acrylate type polymer are totally different in the series of frictional electrification, however, a packaging container comprising them reduces the static electrification amount to be generated on the surface of the component by contact or rubbing between the packaging container and the electronic component.

By suppressing generation of static electricity, impairment due to the static electricity can be suppressed, attachment of the component to the packaging container can be prevented, and static electricity destruction of an electronic component which is sensitive to static electricity can be prevented.

BRIEF DESCRIPTION OF THE DRAWINGS

FIG. 1 illustrates an example of a method for measuring the static electrification amount by using a cylinder.

FIG. 2 illustrates an example of a method for measuring the static electrification amount by using a component to be contained.

FIG. 3 illustrates a tray used for a static electrification test.

FIG. 4 illustrates a carrier tape used for a static electrification test. The numerical reference 1 designates a slope, on which an electronic component is slid down. Numerical reference 2 designates a sheet for measurement of the static electrification amount. Numerical reference 3 designates a column made of a resin. Numerical reference 4 designates a Faraday cage. Numerical reference 5 designates an electronic component.

BEST MODE FOR CARRYING OUT THE INVENTION

Figure 1:
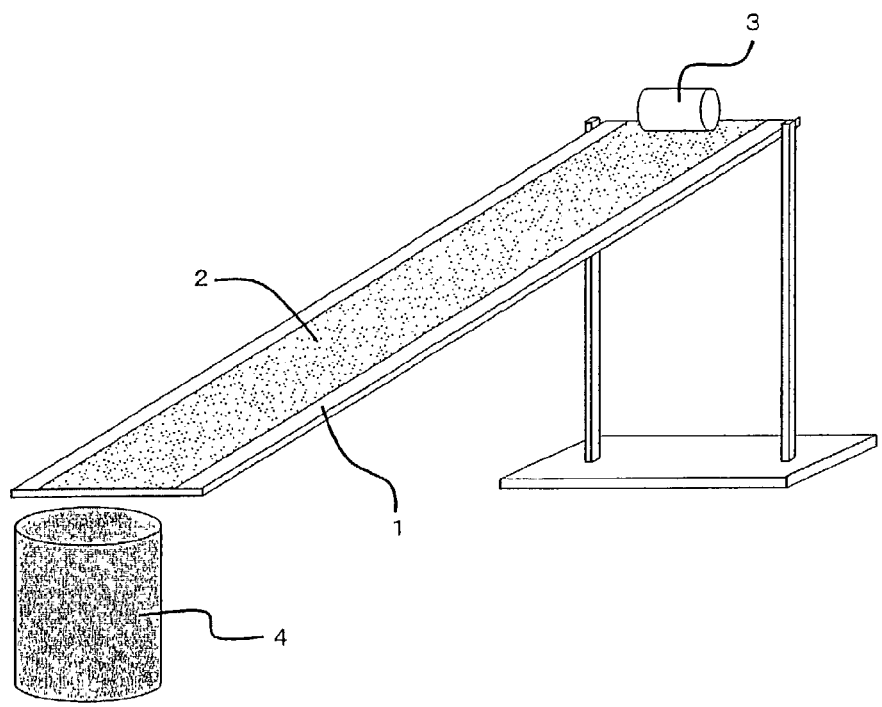
FIGS. 1 to 4 relate to Examples 22 to 25 and Comparative Examples 7 to 14.

Carrier Tape Body with a Small Amount of Peeling Static Electrification Amount

In order to prevent impairment due to static electricity, static electricity itself generated when an electronic component and a packaging container are rubbed must be reduced. With respect to a carrier tape body, static electricity generated when a cover tape is peeled off from an embossed carrier tape must be suppressed also. An embossed tape and a cover tape are preferably such that when the cover tape of the carrier tape body is peeled off with a peeling angle of from 170 to 180 degrees at a peeling rate of 300 mm/min in a peeling amount of 112 mm, and the cover tape with a length of 112 mm is introduced in a Faraday cage to measure the static electrification amount, whereupon the peeling static electrification amount of the cover tape is from −9 to +9 nC in the case of a cover tape having a surface resistivity of at least $10^{11}$ Ω, or it is from −3 to +3 nC in the case of a cover tape having a surface resistivity of less than $10^{11}$ Ω. The constitution and the composition are not particularly limited so long as the peeling static electrification amount of the cover tape is within the above range, but the cover tape preferably comprises a thermoplastic resin.

An electronic component can be contained in a carrier tape by using a cover tape having a surface resistivity of at least $10^{11}$ Ω. When the static electrification amount is from −9 to +9 nC when the cover tape is peeled off, such a problem that the component is attached to the cover tape side due to static electricity can be suppressed. Particularly, the static electrification amount is preferably from −3.0 to +3.0 nC. The effect will be remarkable when the static electrification voltage is from −1.9 to +1.9 kV, preferably from −0.6 to +0.6 kV.

An electronic component which may undergo static electricity destruction such as a semiconductor is preferably contained in a cover tape of less than $10^{11}$ Ω. In such a case, in order to prevent the semiconductor from static electricity, the static electrification amount to be generated when the cover tape is peeled off is from −3 to +3 nC, whereby destruction of the semiconductor due to static electricity can be decreased. Particularly, the static electrification amount is preferably from −1.5 to +1.5 nC. The effect will be remarkable particularly when the static electrification voltage is from −0.2 to +0.2 kV, preferably from −0.1 to +0.1 kV.

The peeling static electrification voltage is the static electrification voltage of a cover tape measured in such a manner that the cover tape of the carrier tape body is peeled off under the same conditions as in measurement of the peeling static electrification amount, and measurement is carried out when the cover tape is peeled off in an amount of 10 mm.

As the embossed tape, it is preferred to use one comprising mainly at least one of a styrene type polymer, a polycarbonate, a polyester and an ethylene type copolymer, as the surface layer.

The styrene type polymer is a polymer obtained by polymerizing an aromatic vinyl compound such as styrene as the main component. For example, a polystyrene, a styrene-butadiene copolymer or its hydrogenated adduct, a styrene-butadiene random copolymer, a styrene-butadiene block copolymer, a styrene-isoprene copolymer, a styrene-maleic anhydride copolymer, high-impact polystyrene, or a copolymer of a styrene derivative such as o-methylstyrene, p-methylstyrene, p-tert-butylstyrene or α-methylstyrene as a styrene type monomer with a conjugated diene monomer such as 1,3-pentadiene, 1,3-hexadiene or 2-methylpentadiene may, for example, be used.

As the polycarbonate, an aromatic polycarbonate such as a bisphenol A type polycarbonate comprising an aliphatic carbonate such as dimethyl carbonate or diethyl carbonate and 2,2-bis(4-hydroxyphenyl)propane, and a mixture containing polyethylene terephthalate or polybutylene terephthalate in an amount of less than 50 wt %, may be employed.

As the polyester, polyethylene terephthalate is mainly used.

They may be used alone or as a mixture of at least two. Processing of such a sheet into an embossed tape may be carried out by a known method such as vacuum forming or air-pressure forming.

In order that the surface resistivity is within the predetermined range, a method of incorporating carbon black or inorganic filler into a resin, or a method of coating an electrically conductive coating or an electron conductive polymer having an inorganic filler dispersed therein, may be mentioned.

The cover tape is preferably one comprising a styrene type copolymer and/or an ethylene type copolymer as a sealant.

As the styrene type copolymer, a copolymer of a styrene type monomer with a conjugated diene type monomer or a high-impact polystyrene may, for example, be employed. The styrene type monomer may, for example, be o-methylstyrene, p-methylstyrene, p-tert-butylstyrene or α-methylstyrene, and the conjugated diene type monomer may, for example, be 1,3-butadiene, 1,3-pentadiene, 1,3-hexadiene or 2-methylpentadiene.

As the ethylene type copolymer, an ethylene-α-olefin copolymer such as ethylene-1-butene, or a copolymer having ethylene units such as an ethylene-vinyl acetate copolymer, ethylene-butyl acrylate, an ethylene-styrene copolymer or an ethylene-maleic anhydride-acrylate copolymer may be employed. They may be used alone or as a mixture of at least two.

As a preferred cover tape in the present invention, such a cover tape may be mentioned that when a MQFP type IC of 28 mm square with a molding compound made of an epoxy resin (such as 28☐MQFP type IC manufactured by NEC Corporation) is slid down in an amount of 250 mm on the storage side surface at an angle of 30 degrees, the frictional static electrification amount is from −0.3 to +0.3 nC. By using such a cover tape, generation of static electricity due to rubbing between the cover tape and an object contained can be suppressed.

In order that the peeling static electrification amount is within a predetermined range, it is effective that thermoplastic resins which are close to each other in the series of frictional electrification are used for the portions of the cover tape and the embossed tape which are to be sealed. When thermoplastic resins which are very different in the series of frictional electrification are used for the cover tape and the embossed tape, generation of static electricity when the cover tape is peeled off tends to be significant, thus increasing the static electrification amount. It is also effective to use a thermoplastic resin on the positive polarity side and a thermoplastic resin on the negative polarity side relative to the thermoplastic resin used for the cover tape in the series of frictional electrification, for the embossed tape. On the contrary, it is also effective to employ a thermoplastic resin on the positive polarity side and a thermoplastic resin on the negative polarity side relative to the thermoplastic resin used for the embossed tape in the series of frictional electrification for the cover tape.

Coating of Antistatic Agent

An antistatic agent may be coated on the cover tape and the embossed tape, and it is particularly preferred to coat it on the cover tape. Although it is possible to coat the antistatic agent on the inside of a pocket of the embossed tape by spraying, however, it takes time for drying to increase cost of the process, and there is a risk such that the antistatic agent is rubbed with a lead pin and is peeled off. However, the above description is not to deny coating of the antistatic agent on an embossed tape in the present invention. It is possible to coat the antistatic agent on the embossed tape in the present invention, and such is recommended when an electronic component which is likely to undergo static electricity destruction is contained.

Preferred as the antistatic agent is a nonionic type such as alkyl diethanol amide, polyoxyethylene alkylamine or alkyldiethanolamine, an anion type such as alkyl phosphate or alkyl sulfonate, a cation type such as a trialkylbenzylammonium salt or a tetraalkylammonium salt, or an amphoteric ion type such as alkylbetaine or alkylimidazoliumbetaine, and particularly preferred is an amphoteric ion type. Further, as a polymer type antistatic agent, a polyether type such as polyethylene oxide, a quaternary ammonium salt type such as a quaternary ammonium salt group-containing acrylate copolymer, or a betaine type such as a carbobetaine graft copolymer may also be used.

The coating thickness of such an antistatic agent is preferably at most 2.0 μm as a thickness after drying. If the coating is thick, the possibility increases such that in a taping step in which the embossed tape is heat-sealed with the cover tape, the antistatic agent is rubbed with a guide pin and accumulated on the pin surface, and the accumulated antistatic agent falls down on an article contained, thus leading to contamination, such being unfavorable. As a method of coating such an antistatic agent, a known method such as a roll coater of e.g. a mirror surface or gravure or a method of spraying it in the form of mist may be mentioned.

Control of Static Electricity by Series of Frictional Electrification

In order to suppress static electricity generated when the cover tape of a carrier tape body is peeled off, it is preferred that a side of the cover tape which faces an electronic component contains a resin which is likely to be positively charged and a resin which is likely to be negatively charged relative to a side of the electronic component which faces the cover tape in the series of frictional electrification.

The series of frictional electrification is obtained in such a manner that substances are rubbed with each other and ranked in the order from a substance which is likely to be positively charged to a substance which is likely to be negative charged. The static electrification polarity of a substance varies depending upon an object to be rubbed with, and when a substance on the positive polarity side and a substance on the negative polarity side are rubbed with each other, the substance on the positive polarity side is charged positively, and the substance on the negative polarity side is charged negatively. This order can be explained by work function or Fermi level, and one at a high Fermi level is on the positive polarity side in the series of frictional electrification and one at a low Fermi level is on the negative polarity side.

An electronic component such as a semiconductor is charged by static electricity due to e.g. shake or rubbing with a packaging material which contains the electronic component, the static electricity passes through a lead wire or a solder ball when the electronic component is mounted on e.g. a substrate, thus generating an electric current, which leads to short-circuiting of a gate oxide layer or an insulating layer in wiring between layers, whereby ESD (electrostatic discharge) destruction such as heat destruction or insulating layer destruction takes place. Accordingly, it is important that the electronic component itself is not charged, in order to avoid ESD destruction.

For the side of the electronic component such as a semiconductor which faces the cover tape, a curing agent of an amine type and an epoxy resin of cresol novolak type or bisphenol A type, called a mold resin, is used. In such a mold resin, a filler such as crystalline silica or fused silica is further added in general. In addition, imidazole which accelerates a curing reaction of an epoxy resin or a curing accelerator which is a phosphorus compound may be added. Further, silicone or a phenol resin may be used in a casting method, a coating method, a dipping method, a potting method or a powder coating method in addition to such a low pressure transfer molding method.

In the case of an epoxy resin which is the mainstream of mold resins, as resins on both sides in the series of frictional electrification, a styrene type polymer, a polycarbonate or an acryl type resin may, for example, be mentioned as a resin on the positive polarity side in the series of frictional electrification, and a polyethylene type resin or a polyvinyl chloride resin may, for example, be mentioned as a resin on the negative polarity side in the series of frictional electrification.

As the acryl type resin, a methyl, ethyl, normal butyl ester and 2-ethylbutyl, 2-ethylhexyl, octyl, methoxyethyl, ethoxyethyl, 3-ethoxypropyl, hexyl, cyclohexyl or decyl ester of acrylic acid or methacrylic acid, a copolymer thereof and an ethylene vinyl acetate copolymer may, for example, be mentioned.

As the polyethylene type resin, polyethylene, a copolymer of ethylene with α-olefin having a carbon number of at least 3 and having a side chain, such as propene, butene or hexene, a very low density polyethylene or a linear low density polyethylene may, for example, be mentioned.

In order to use a resin on the positive polarity side and a resin on the negative polarity side in the series of frictional electrification, a copolymer or a graft product containing these structures may be employed, in addition to the above-mentioned method. Such a resin may, for example, be a graft copolymer obtained by graft polymerization of a styrene chain to a polyethylene chain.

The resin on the positive polarity side and the resin on the negative polarity side in the series of frictional electrification are preferably used in their weight ratio within a range of from 77:23 to 23:77. In such a case, addition of a stabilizer such as antioxidant in an amount within a range of addition purpose has no influence over the present invention. Needless to say, it is possible to employ such an addition and to decrease surface resistivity, which protects the electronic component from static electrification of e.g. a packaging material, which is a conventional method, together.

In the present invention, as the cover tape, it is preferred to use such a cover tape that the static electrification voltage on the electronic component side is at most ±1000 V when the side of the cover tape which faces an electronic component and an electronic component are shaken at 300 back-and-forth motions/min with a vibration width of 5 mm for one minute. Here, the electronic component is an electronic component contained in the carrier tape body, or a MQFP type IC of 28 mm square with a molding compound made of an epoxy resin (such as 28☐MQFP manufactured by NEC Corporation).

Container Employing Polyvinylidene Fluoride Polymer and Acrylate Type Polymer

As mentioned above, it is important to prevent static electricity generated when the cover tape is peeled off. In addition, the material of a bottom tape on which an electronic component is contained is also important.

For the surface of the packaging container to be in contact with an electronic component, a material which is close to a molding compound for the electronic component in the series of frictional electrification may be used, or a positive polarity material and a negative polarity material in the series of frictional electrification may be used. For example, when a vinylidene fluoride polymer and an acrylate type polymer are contained, the static electrification amount generated on the surface of a component by contact or rubbing between the packaging container and the electronic component can be decreased.

The vinylidene fluoride polymer and the acrylate type polymer are very different in the series of frictional electrification, whereas these polymers have such a characteristic that they are likely to be mixed with each other in an optional proportion. Accordingly, by adjusting the blend ratio of these polymers, a composition close to the composition of the resin component constituting a molding compound for an electronic component to be contained in the series of frictional electrification can be achieved, and thus it is possible to suppress static electrification due to contact or rubbing between the electronic component and the packaging container.

The vinylidene fluoride polymer is a polymer obtained by polymerizing vinylidene fluoride as the main component, and a homopolymer and a copolymer may be mentioned. The copolymer may, for example, be a vinylidene fluoride-tetrafluoroethylene-hexafluoropropylene type copolymer or a vinylidene fluoride-hexafluoropropylene type copolymer.

The acrylate type polymer is a polymer obtained by polymerizing an acrylate as the main component, and a homopolymer and a copolymer may be mentioned. The acrylate may, for example, be an acrylate or a methacrylate, and in the present invention, a crotonate is also included. One or more kinds of these acrylates may be used together. As the acrylate type polymer, a methyl methacrylate polymer capable of being blended with a vinylidene fluoride polymer in an optional proportion is preferred. The acrylate type polymer may be a blended product with an acryl type rubber so as to impart strength against impact.

As a method of blending a vinylidene fluoride polymer with an acrylate type polymer, it is possible to employ a common means such as a method of mechanically mixing them with a Henschel or Tumbler, followed by melt-kneading with a twin screw extruder, and the method is not particularly limited. As the vinylidene fluoride polymer and the acrylate type polymer, commercially available ones may be used.

As a means to define the position of the electronic component and the packaging container in the series of frictional electrification, a method may be mentioned wherein a slope is made by a sheet made of a resin constituting the electronic component as illustrated in FIG. 1, the charge on the sheet is destaticized with ionized air or a water-soluble organic solvent such as an alcohol or acetone, a cylinder made of a resin destaticized with ionized air or a water-soluble organic solvent such as an alcohol or acetone is rolled from the upper part of the slope, and the charge amount generated on the cylinder was measured by a Faraday cage. In the same method, using sheets comprising blended products of a vinylidene fluoride polymer with an acrylate type polymer in various proportions, it is possible to obtain the proportions and the positions in the series of frictional electrification of the vinylidene fluoride polymer and the acrylate type polymer. The closer the charge amounts on the cylinder of the resin constituting the electronic component and the blended product of a vinylidene fluoride polymer with an acrylate type polymer, the closer the positions of them in the series of frictional electrification.

Figure 2:
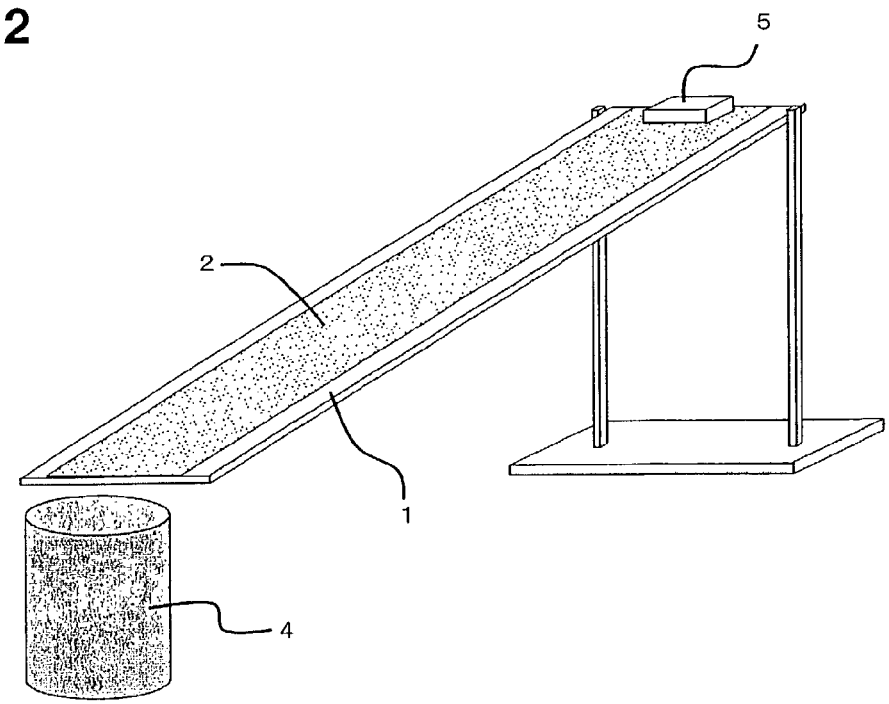

As another method, as shown in FIG. 2, a component destaticized with ionized air or a water-soluble organic solvent such as an alcohol or acetone is slid down from the upper part of a slope made by each of sheets comprising blended products of a vinylidene fluoride polymer with an acrylate type polymer in various proportions, destaticized with ionized air or a water-soluble organic solvent such as an alcohol or acetone, and the charge amount generated on the component is measured by a Faraday cage. In the present method, the blended product of vinylidene fluoride with an acrylate type polymer in such a proportion that the absolute value of the static electrification amount of the electronic component becomes small, is close to the component in the series of frictional electrification.

With respect to the present packaging container, the packaging container surface to be in contact with the electronic component contains a vinylidene fluoride polymer and an acrylate type polymer, and preferred is one such that the static electrification amount generated on the electronic component after rubbing of 300 times is at most 1 nC, more preferably at most 0.8 nC. Within this range, attachment of the electronic component to the packaging container surface or popping out due to static electricity, or impairment or breakage due to static electricity in the case where the electronic component is contained, can further effectively be prevented. In order that the static electrification amount generated after rubbing of 300 times is at most 1 nC, more preferably at most 0.8 nC, the proportion of the vinylidene fluoride polymer and the acrylate type polymer may be adjusted, and the position of the packaging container in the series of frictional electrification may be matched with the electronic component in the series of frictional electrification by the above method.

It is also possible to impart an electrical conductivity with a surface resistivity of from $10^2$ to $10^{12}$ $\Omega/\square$ to the packaging container. This is effective to remove static electricity generated on the surface of the packaging container. The method of impartment is not particularly limited, and a method of adding to a polymer an electron conductive substance such as metal fibers such as steel fibers, aluminum fibers, brass fibers, copper fibers or stainless fibers, a metal oxide such as electrically conductive titanium oxide or zinc oxide, carbon fibers, carbon fibers subjected to a surface coating treatment by a metal such as nickel, carbon black, a graphite powder or glass fibers coated with a metal, or a method of adding a nonionic type, cationic type, anionic type or betaine type surface active agent, or a method of adding an ion conduction substance such as a permanent antistatic agent such as a polymer polyether amide may, for example, be mentioned. Otherwise, it is also possible to impart electrical conductivity by coating a carbon fine powder on the surface or carrying out a coating treatment of a polymer type electrically conductive material such as polypyrrole.

It is preferred that the entire surface to be in contact with the component contains a vinylidene fluoride polymer and an acrylate type polymer, however, it is possible that the main part or a part which contacts the component in a large area, contains these polymers. The packaging container of the present invention includes such. The packaging container surface to be in contact with the electronic component containing a vinylidene fluoride polymer and an acrylate type polymer means that a part or the entire part which contacts the electronic component contains such polymers. In this case, needless to say, it is preferred that the entire part which contacts the component contains a vinylidene fluoride polymer and an acrylate type polymer in order to prevent generation of static electricity.

It is not problematic in the present invention that the surface which does not contact the component contains a vinylidene fluoride polymer and an acrylate type polymer. The packaging container of the present invention includes such. The surface which does not contact the component includes the exterior and the whole area of the container.

Resin with a Small Friction Static Electrification Amount

Figure 5:
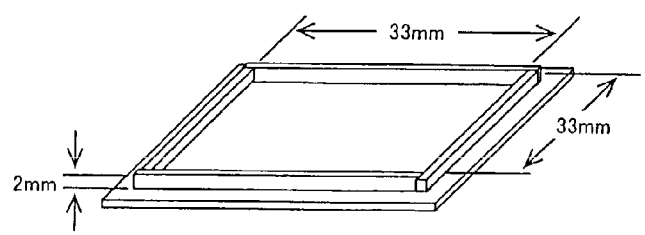
FIG. 5 illustrates a rubbing test specimen.

With respect to the container for an electronic component, for the part to be in contact with an electronic component, a material which generates a small amount of static electricity when rubbed with the electronic component is preferably employed. Specifically, preferred is such a resin composition that when a molded product of a resin composition as shown in FIG. 5 and an electronic component are rubbed at a rate of 600 revolutions/min for 5 minutes, the absolute value of the static electrification amount generated on the electronic component is at most 1 nC, preferably at most 0.8 nC.

For example, a resin composition containing an acrylate type polymer, a styrene type polymer and an electrical conductivity-imparting material may be mentioned. Preferred is a resin composition containing from 1 to 50 parts by weight of an electrical conductivity-imparting material based on a total amount of 100 parts by weight of from 50 to 2 parts by weight of an acrylate type polymer and from 50 to 98 parts by weight of a styrene type polymer.

Also preferred is a resin composition containing an acrylate type polymer, a polyphenylene ether, a styrene type polymer and an electrical conductivity-imparting material. More preferred is a resin composition containing from 1 to 50 parts by weight of an electrical conductivity-imparting material based on a total amount of 100 parts by weight of from 50 to 2 parts by weight of an acrylate type polymer, and a total amount of from 50 to 98 parts by weight of a polyphenylene ether and a styrene type polymer.

The electrical component may be an electrical component, which the packaging container using such a resin composition actually contains, or an IC used in Examples of the present invention. The smaller the absolute value of the static electrification amount, the more the impairment due to static electricity can be prevented.

The composition of the resin composition is not particularly limited so long as the absolute value of the static electrification amount of the rubbed electronic component is small. One having an electrical conductivity-imparting material added to an acrylate type polymer and a styrene type polymer or one having an electrical conductivity-imparting material added to an acrylate type polymer, a polyphenylene ether and a styrene type polymer may be suitably used. The acrylate type polymer, the styrene type polymer and the polyphenylene ether are greatly different in the series of frictional electrification, whereas these polymers have such a characteristic that they are likely to be mixed with one another. Accordingly, by adjusting the blend ratio of these polymers, the composition close to the resin component constituting the molding compound for an electronic component to be contained in the series of frictional electrification can be achieved, and static electrification due to contact or rubbing between the electronic component and the packaging container can be suppressed.

As the acrylate type polymer, a methyl methacrylate polymer which can be blended with a styrene type polymer is preferred. The acrylate type polymer may be a blended product with an acryl type rubber in order to impart strength against impact.

The polyphenylene ether is a homopolymer or a copolymer having at least one structural unit as shown in Formula (1), or a blended product thereof. In the Formula (1), n is an integer of at least 5, and each of $R_1$ to $R_4$ which are independent of one another, is selected from hydrogen, a halogen, a hydrocarbon group, an oxyhalohydrocarbon group, etc. Representatives of such a structural unit include 1,4-phenylene ether, 2,6-dimethyl-1,4-phenylene ether, 2,6-diethyl-1,4-phenylene ether, 2-methyl-6-ethyl-1,4phenylene ether and 2,6-diphenyl-1,4-phenylene ether.

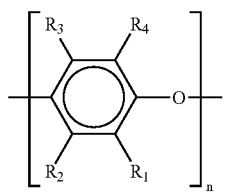

Formula (1)

The mixture ratio of the acrylate type polymer and the styrene type polymer is such that the styrene type polymer is preferably from 98 to 50 parts by weight based on from 50 to 2 parts by weight of the acrylate type polymer, more preferably the styrene type polymer is from 60 to 90 parts by weight based on from 40 to 10 parts by weight of the acrylate type polymer.

In the case of a resin comprising an acrylate type polymer, a styrene type polymer and a polyphenylene ether, the mixture ratio is preferably such that the total amount of the styrene type polymer and the polyphenylene ether is from 98 to 50 parts by weight based on from 50 to 2 parts by weight of the acrylate type polymer, more preferably the total amount of the styrene type polymer and the polyphenylene ether is from 60 to 90 parts by weight based on from 40 to 10 parts by weight of the acrylate type polymer. If the proportion of the acrylate type polymer is high, the charge amount generated on the electronic component at the time of rubbing with the electronic component tends to be high, such being unfavorable.

The resin composition preferably has an electrical conductivity with a surface resistivity of at most $10^{12}$ Ω/□, and in order to achieve this, an electrical conductivity-imparting material may be incorporated. If the surface resistivity is high, generated static electricity is less likely to be destaticized. It is effective to make the resistance of the container low, in order to remove static electricity generated on the surface of the packaging container. The electrical conductivity-imparting material is to improve electrical conductivity when added to a resin composition, and the type is not particularly limited. For example, metal fibers such as steel fibers, aluminum fibers, brass fibers, copper fibers or stainless fibers, a metal oxide such as electrical conductive titanium oxide or zinc oxide, carbon fibers, carbon fibers subjected to a surface coating treatment with a metal such as nickel, carbon black, a graphite powder, glass fibers coated with a metal, a nonionic type, cationic type, anionic type or betaine type surface active agent, or an ion conduction substance such as a permanent antistatic agent such as a polymer polyether ester amide may be mentioned.

The method for producing the resin composition is not particularly limited. For example, as a method of blending an acrylate type polymer, a styrene type polymer and a polyphenylene ether, a method of mechanically mixing by a Henschel or a tumbler, followed by melt-kneading with a twin screw extruder, may be mentioned.

The method of incorporating a vinylidene fluoride polymer and an acrylate type polymer into the surface of the packaging container may be applied to one other than the packaging container, and the impairment due to static electricity can be decreased also. For example, a component made of a resin is likely to be charged with static electricity for example, and by covering the surface with a composition optimized with a vinylidene fluoride polymer and an acrylate type polymer, charging due to static electricity can be prevented. In this case, the component itself may be made of a vinylidene fluoride polymer and an acrylate type polymer so long as required physical properties such as strength are satisfied. Such a component can be adjusted with the series of frictional electrification of an object to be rubbed with, and thus the object itself is less likely to be charged, and impairment due to static electricity can be prevented. The method of coating an antistatic agent is merely prevent static electrification temporarily, whereas the effect by this method is not like that. With a combination of polymers which are significantly different in the series of frictional electrification and which are compatible with each other, such as a vinylidene fluoride polymer and an acrylate type polymer, the effect against static electricity of the present invention can be obtained.

In the present invention, by employing a composition of the container which is less likely to generate static electricity, and by roughening the surface of the container to be in contact with an electronic component, it is possible to reduce static electricity generated when the electric component and the container are contacted with each other. The surface of the container is such that Ra as defined in JIS B-0601 is at least 0.5 µm, preferably at least 1 µm, and/or Rmax as defined in JIS B-0601 is at least 5 µm, preferably at least 10 µm. When Ra is at least 0.5 µm or Rmax is at least 5 µm, the area of contact between the electronic component and the container for an electronic component decreases at the time of rubbing, whereby static electrification on the surface of the electronic component can be inhibited.

The method of imparting the predetermined surface roughness to the container for an electronic component is not particularly limited. For example, in a case where a tray as the container for an electronic component is produced by injection molding, the roughness on the surface of the container for an electronic component as a molded product can be adjusted by adjusting the roughness on the surface of a mold to be used for the injection molding.

In a case where the container is prepared from a sheet, the surface of the container for an electronic component as a molded product may be roughened by preliminarily adjusting the roughness on the surface of the sheet. The method of adjusting the surface roughness of the sheet is not particularly limited, but a method of using a rubber roll containing sand as a pinch roll of a resin in a molten state extruded at the time of sheet preparation, may be mentioned. A method of using as a pinch roll, a roll having depressions and protrusions formed on the surface by sandblast treatment, a method of using an engraved roll, or a method of reheating a sheet after preparation by in-line or off-line, and pinching it by means of a rubber roll and/or a roll subjected to sandblast treatment or an engraved roll, may also be mentioned.

A method of forming depressions and protrusions on the surface by means of sandblast treatment, after the container for an electronic component is formed, may be mentioned. In a case of a carrier tape, it may be prepared by e.g. plug forming wherein a prepared sheet is heated and sandwiched between molds, on which depressions and protrusions are preliminarily formed by means of e.g. sandblast treatment. In a case where e.g. a tray or a container is prepared by injecting a molten resin into a mold, depressions and protrusions may be preliminarily formed on the mold by means of e.g. sandblast treatment. By increasing the surface roughness of the container for an electronic component, the area of contact between the electronic component and the container for an electronic component can be reduced, whereby the static electrification voltage of the electronic component at the time of rubbing can be suppressed low.

As another method of forming depressions and protrusions on the surface, a coating containing a fine powder of e.g. spherical silica may be coated on the surface of the container sheet for an electronic component after molding by means of e.g. a bar coater to form depressions and protrusions on the surface. It is also possible to blend an antistatic agent with the coating or blending a fine carbon powder or an electrical conductive agent such as polypyrrole, to impart antistatic properties and electrical conductivity simultaneously.

The above container for an electronic component can be produced by a thermoplastic resin, and the type of the thermoplastic resin is not particularly limited. It is preferably polyvinyl chloride, polyethylene, polypropylene, a styrene homopolymer resin or a rubber-modified polystyrene type resin, having favorable impact resistance strength, or a polyphenylene ether type resin, a polycarbonate type resin or a polyester type resin, further having heat resistance. Such a resin may be a random copolymer resin, a block copolymer resin or a graft copolymer resin. One or more kinds of the thermoplastic resins may be used.

The container for an electronic component can be produced also from a sheet for packaging an electronic component, which employs a thermoplastic resin.

To the container for an electronic component, an electrical conductivity with a surface resistivity of from $10^2$ to $10^{12}$ Ω/□ can be imparted. This is effective to remove generated static electricity. The method is not particularly limited, but a method of adding an electronic conduction substance such as metal fibers such as steel fibers, aluminum fibers, brass fibers, copper fibers or stainless fibers, a metal oxide such as an electrically conductive titanium oxide or zinc oxide, carbon fibers, carbon fibers subjected to a metal coating treatment, carbon black, a graphite powder or glass fibers coated with a metal, to a thermoplastic resin within a range of not impairing the surface roughness, or a method of adding a nonionic, cationic, anionic or betaine type surface active agent, or an ion conduction substance such as a permanent antistatic agent of e.g. a polymer polyether type, to a thermoplastic resin, may be mentioned. Otherwise, it is possible to impart electrical conductivity by coating a carbon fine powder on the surface or coating a polymer type electrically conductive material such as polypyrrole. This is similarly applicable to a sheet for packaging an electronic component.

Although it has already been described above, it is possible to coat an antistatic agent on the surface of the packaging container. This is effective to remove generated static electricity. The antistatic agent may, for example, be a common antistatic agent of nonionic, cationic, anionic or betaine type. As the coating method, a known method such as gravure coating, roll coating, dip coating or spraying may be employed. Further, as the case requires, it is possible to conduct a corona discharge treatment on the coated surface of the sheet, or to subject the sheet to a primer treatment by means of another coating agent. This is similarly applicable to a sheet for packaging an electronic component.

The packaging container may have a multilayer structure. It is also possible to laminate a resin different from one for the surface to be in contact with the component, in a thickness direction to obtain a multilayer packaging container, whereby flexing strength, tensile strength, rigidity, etc. may be changed. The method is not particularly limited, however, a method of forming a molten resin into a multilayer by means of a feed block provided between an extruder and die by using a plurality of extruders, followed by extrusion from a T-die to form a multilayer sheet, a method of extruding a molten resin from a multi-manifold die to obtain a multilayer by using a plurality of extruders, or a method of heating a prepared individual sheet for softening again, followed by forming into a multilayer, may, for example, be mentioned. Further, in the case of an injection molded product, a multilayer forming means may be employed.

To the resin to be used for the container for an electronic component, another component may be added. An additive which increases the static electrification voltage to be generated on the electronic component by rubbing with the electronic component should be avoided, or the amount should be small. The another component may, for example, be talc, mica or silica, a metal oxide such as alumina, potassium titanate whisker or calcium oxide, or a bulking agent such as calcium carbonate, magnesium carbonate, calcium silicate, glass fibers, glass flakes or glass beads. An electrically conductive material such as metal fibers such as non-carbon fibers, steel fibers, aluminum fibers, brass fibers, copper fibers or stainless fibers, carbon fibers, carbon fibers coated with a metal, carbon black, a graphite powder or glass fibers coated with a metal may also be added. It is possible to impart electrical conductivity to the resin by addition of such a component. The container for an electronic component being electrically conductive makes no problem but is one of preferred embodiments. In such a case, a part to be in contact with an electronic component alone may have electrical conductivity, or the container for an electronic component may have a structure comprising at least two layers, and the layer not to be in direct contact with the electronic component may have electrical conductivity.

With the container for an electronic component and the resin, a reinforcing material, a foaming agent, a lubricant, an antioxidant, an ultraviolet protecting agent, a coupling agent, a flame retardant, a flame resisting assistant such as antimony trioxide, a heat resisting stabilizer or a coloring agent may be incorporated within the range of not impairing the purpose of the present invention.

In the present invention, the packaging container means a container in which an electronic component is packaged. It may, for example, be a magazine, a carrier tape, a tray, a bag or a container. They can be obtained by injection molding, or by forming a sheet for packaging an electronic component into the shape of a container for an electronic component such as a carrier tape or a tray by a known method such as press molding, vacuum forming or air-pressure forming, or a magazine shape can be obtained by contour extrusion. Further, it is also possible to prepare a film by an inflation method or a melt extrusion method from die, and to form this film into a bag shape by heat fusion or by an adhesive to prepare a bag. Such a container is mainly used for containment, storage or transport of an electronic component, or used when such a component is mounted.

The method of preparing the packaging container and the sheet is not particularly limited. A known sheet forming method such as injection molding, sheet vacuum forming, pressure forming or press molding, T-die molding by means of an extruder, calendar forming or casting with a solvent, may be employed. In a case of using a plurality of resins, a material mixed by means of e.g. a tumbler or a mazelar as the case requires, may be subjected to fusion kneading extrusion by means of a single axis extruder or a biaxial extruder or fusion kneading by means of a Brabender to obtain a resin, which is formed into a sheet by the above method.

EXAMPLES

Examples 1 to 17 and Comparative Examples 1 to 3 relate to the above carrier tape body with a small amount of peeling static electrification.

Examples 1 to 17

An anchor coating treatment was applied to one side of an O-PET film having a thickness of 25 μm, and a molten low density polyethylene was extruded thereon in a thickness of 15 μm to obtain a film having a thickness of 40 μm. On the polyethylene side of this film, each of resins as identified in Tables 1 to 6 was laminated in a thickness of 15 μm by fusion extrusion. Further, in Examples 4 to 6, 10 to 12 and 15 to 17, an alkyl betaine type antistatic agent was coated on both sides of each of the films of Examples 1 to 3, 7 to 9, 13 and 14, in a thickness of 0.1 μm.

Comparative Examples 1, 2 and 3

The same operation as in Examples was carried out except that resins and embossed tapes as identified in Comparative Examples 1 to 3 were used, and an alkyl betaine type antistatic agent was coated on both sides in a thickness of 0.1 μm in Comparative Examples 2 and 3.

Measurement of Surface Resistivity of Cover Tape

A test specimen of 10 cm×10 cm was cut out, and measurement was carried out at a temperature of 23° C. at a relative humidity of 50% for a measurement time of 60 seconds.

Measurement of Peeling Static Electrification Amount

A film having a width of 21.5 mm was heat-sealed on an embossed tape having a width of 24 mm and a pocket pitch of 16 mm by using a seal head having a length of 32 mm and a width of 0.5 mm for a sealing time of 0.4 second. The static electrification amount of this carrier tape body was decreased to 0±0.01 nC by using a destaticizer manufactured by SIMCO JAPAN, and the film was peeled off at a peeling angle of from 170 to 180 degrees at a peeling rate of 300 mm/min in a peeling amount of 112 mm, and the charge of the film was measured by using a Faraday cup manufactured by ETS. The measurement was carried out at a temperature of 23° C. at a relative humidity of 20±3%.

Measurement of Peeling Static Electrification Voltage

The same carrier tape body as for measurement of the peeling static electrification amount was prepared, and peeling was carried out under the same condition. Measurement was carried out when the film was peeled off in an amount of 10 mm from the peeling start point, at a point of 50 mm above the film by using a static electrification voltage measuring apparatus manufactured by KEYENCE CORPORATION (SK200) in a non-contact mode.

Measurement of Frictional Static Electrification Amount

A prepared film was fixed on a surface at an inclination angle of 30 degrees, a 28 mm square MQFP type IC manufactured by NEC Corporation was slid down on the film in an amount of 250 mm, and the charge amount generated on the 28 mm square MQFP type IC manufactured by NEC Corporation was measured by using an apparatus provided with a Faraday cup manufactured by ETS at the point of fall.

TABLE 1

|  | Example 1 | Example 2 | Example 3 |
|---|---|---|---|
| Resin used | Styrene-butadiene copolymer | Ethylene-ethyl acrylate and ethylene-vinyl acetate copolymer (1:1 blended product) | Styrene-butadiene copolymer and ethylene-maleic anhydride-acrylate copolymer (1:1 blended product) |
| Antistatic treatment | Nil | Nil | Nil |
| Surface resistivity Ω | $10^{14}$ | $10^{14}$ | $10^{14}$ |
| Embossed tape | Styrene type resin A | Styrene type resin A | Styrene type resin A |
| Peeling static electrification amount nC | −8 | +6 | −5 |
| Peeling static electrification voltage V | −1800 | +1500 | −1000 |
| Frictional static electrification amount nC | +0.25 | −0.27 | +0.21 |

TABLE 2

|  | Example 4 | Example 5 | Example 6 |
|---|---|---|---|
| Resin used | Styrene-butadiene copolymer | Ethylene-ethyl acrylate and ethylene-vinyl acetate copolymer (1:1 blended product) | Styrene-butadiene copolymer and ethylene-maleic anhydride-acrylate copolymer (1:1 blended product) |
| Antistatic treatment | Done | Done | Done |
| Surface resistivity Ω | $10^{10}$ | $10^{9}$ | $10^{9}$ |
| Embossed tape | Styrene type resin A | Styrene type resin A | Styrene type resin A |
| Peeling static electrification amount nC | 0.01 | −0.4 | 0.00 |
| Peeling static electrification voltage V | −20 | −63 | +6 |
| Frictional static electrification amount nC | +0.08 | −0.27 | −0.1 |

TABLE 3

|  | Example 7 | Example 8 | Example 9 |
|---|---|---|---|
| Resin used | Styrene-butadiene copolymer | Ethylene-ethyl acrylate and ethylene-vinyl acetate copolymer (1:1 blended product) | Styrene-butadiene copolymer and ethylene-maleic anhydride-acrylate copolymer (1:1 blended product) |
| Antistatic treatment | Nil | Nil | Nil |
| Surface resistivity Ω | $10^{14}$ | $10^{14}$ | $10^{14}$ |
| Embossed tape | Styrene type resin B | Styrene type resin B | Styrene type resin B |
| Peeling static electrification amount nC | −4.4 | +3.6 | −4.5 |
| Peeling static electrification voltage V | −980 | +780 | −280 |

TABLE 4

|  | Example 10 | Example 11 | Example 12 |
|---|---|---|---|
| Resin used | Styrene-butadiene copolymer | Ethylene-ethyl acrylate and ethylene-vinyl acetate copolymer (1:1 blended product) | Styrene-butadiene copolymer and ethylene-maleic anhydride-acrylate copolymer (1:1 blended product) |

TABLE 4-continued

| Antistatic treatment | Done | Done | Done |
|---|---|---|---|
| Surface resistivity Ω | $10^{10}$ | $10^9$ | $10^9$ |
| Embossed tape | Styrene type resin B | Styrene type resin B | Styrene type resin B |
| Peeling static electrification amount nC | +0.04 | −0.29 | +0.00 |
| Peeling static electrification voltage V | +8 | −6 | −3 |

TABLE 5

|  | Example 13 | Example 14 | Example 15 |
|---|---|---|---|
| Resin used | Styrene-butadiene copolymer and ethylene-maleic anhydride-acrylate copolymer (1:1 blended product) | Styrene-butadiene copolymer and ethylene-maleic anhydride-acrylate copolymer (1:1 blended product) | Styrene-butadiene copolymer and ethylene-maleic anhydride-acrylate copolymer (1:1 blended product) |
| Antistatic treatment | Nil | Nil | Done |
| Surface resistivity Ω | $10^{14}$ | $10^{14}$ | $10^9$ |
| Embossed tape | Polycarbonate A | Polycarbonate B | Polycarbonate A |
| Peeling static electrification amount nC | −8.4 | −8.8 | −0.89 |
| Peeling static electrification voltage V | −390 | −290 | −150 |

TABLE 6

|  | Example 16 | Example 17 |
|---|---|---|
| Resin used | Styrene-butadiene copolymer and ethylene-maleic anhydride-acrylate copolymer (1:1 blended product) | Styrene-butadiene copolymer and ethylene-maleic anhydride-acrylate copolymer (1:1 blended product) |

TABLE 6-continued

| Antistatic treatment | Done | Done |
|---|---|---|
| Surface resistivity Ω | $10^9$ | $10^9$ |
| Embossed tape | Polycarbonate B | Polyester |
| Peeling static electrification amount nC | −0.53 | −2.6 |
| Peeling static electrification voltage V | −4 | −130 |

TABLE 7

|  | Comparative Example 1 | Comparative Example 2 | Comparative Example 3 |
|---|---|---|---|
| Resin used | Styrene-butadiene copolymer and ethylene-maleic anhydride-acrylate copolymer (1:1 blended product) | Styrene-butadiene copolymer and ethylene-maleic anhydride-acrylate copolymer (1:1 blended product) | Polyester type thermo-compression adhesive |
| Antistatic treatment | Nil | Done | Done |
| Surface resistivity Ω | $10^{14}$ | $10^9$ | $10^{10}$ |
| Embossed tape | Polyvinyl chloride type resin | Polyvinyl chloride type resin | Styrene type resin A |
| Peeling static electrification amount nC | +19 | +12 | +12 |
| Peeling static electrification voltage V | +3300 | +2600 | +2800 |
| Frictional static electrification amount nC | — | — | −1.1 |

Materials used in Examples 1 to 17 and Comparative Examples 1 to 3 are as follows.

Resins Used:

Styrene-butadiene copolymer: A blended product of DENKA CLEAREN (70 parts by weight) and DENKA STR1250 (30 parts by weight)

Ethylene-maleic anhydride-acrylate copolymer: Nippon Polyolefin ET-184M

Ethylene-ethyl acrylate: DPDJ-6169 manufactured by Nippon Unicar

Ethylene-vinyl acetate copolymer: NUC3460 manufactured by Nippon Unicar

Polyester type thermocompression adhesive: SEIKADINE T manufactured by Dainichiseika Color & Chemicals Mfg. Co., Ltd. (cover tape)

Styrene type resin A: A molded product of DENKA CLEAREN sheet (surface resistivity of the sheet: $10^{14}$ Ω/□)

Styrene type resin B: A molded product of DENKA THERMOSHEET EC (surface resistivity of the sheet: $10^5$ Ω/□)

Polycarbonate A: A molded product obtained by extruding L1250 manufactured by TEIJIN CHEMICALS LTD. in a thickness of 0.3 mm, and subjecting the extruded product to an embossing molder manufactured by EDG.

Polycarbonate B: A molded product obtained by preliminarily fusion-mixing DENKA ACETYLENEBLACK with L1250 manufactured by TEIJIN CHEMICALS LTD., extruding the mixture in a thickness of 0.3 mm, and subjecting the extruded product to an embossing molder manufactured by EDG.

Polyester: A molded product of DENKA APET sheet

When a cover tape is peeled off after an electronic component is contained, transported and conveyed in the carrier tape of each of Examples, static electricity is less likely to generate, and attachment of the electronic component to the cover tape can be prevented, and at the same time, static electricity destruction of the electronic component can be prevented.

Examples 18 to 21 and Comparative Examples 4 to 6 relate to control of static electricity by the series of frictional electrification.

Examples 18 to 21

A urethane type anchor coating treatment was applied to one side of a biaxially oriented PET film having a thickness of 25 μm, and a molten low density polyethylene was extruded thereon in a thickness of 15 μm to obtain a film having a thickness of 40 μm. On the polyethylene side of this film, each of resins as identified in Table 8 was laminated in a thickness of 30 μm by fusion extrusion.

Comparative Examples 4 to 6

The same operation as in Examples 18 to 21 was carried out except that each of resins as identified in Table 9 was used.

Measurement of Static Electrification Voltage

The side of the resin as identified in Table 8 of the cover tape was made to face upward, a 28 mm square MQFP type IC manufactured by NEC Corporation, the static electrification voltage of which was adjusted to ±0.03 kV by a destaticizer, was put thereon so that a lead wire faced upward, and shaking with a vibration width of 5 mm at 300 back-and-forth motions/min was carried out for 1 minute, and the electronic component was taken out by means of tweezers made of an insulant to measure the static electrification voltage (by means of a static electrification voltage measuring apparatus SK200 manufactured by Keyence Corporation in a non-contact mode) with n=10. The absolute values of the average of measured values are shown in Tables.

TABLE 8

| | Example 18 | Example 19 | Example 20 | Example 21 |
|---|---|---|---|---|
| Resin used | 50 Parts by weight of styrene-butadiene random copolymer: 50 parts by weight of C6 linear low density polyethylene | 75 Parts by weight of styrene-butadiene random copolymer: 25 parts by weight of C6 linear low density polyethylene | 100 Parts by weight of ethylene-graft styrene polymer | 30 Parts by weight of ethylene-ethyl acrylate: 30 parts by weight of styrene-butadiene random copolymer: 40 parts by weight of low density polyethylene |
| Static electrification voltage of component V | 200 | 900 | 300 | 450 |

TABLE 9

| | Comparative Example 4 | Comparative Example 5 | Comparative Example 6 |
|---|---|---|---|
| Resin used | 50 Parts by weight of styrene-butadiene random copolymer: 50 parts by weight of high-impact polystyrene | 100 Parts by weight of styrene-butadiene random copolymer | 100 Parts by weight of ethylene-vinyl acetate copolymer |
| Static electrification voltage of component V | 2200 | 1900 | 1800 |

Materials used in Examples 18 to 21 and Comparative Examples 4 to 6 are as follows:

Styrene-butadiene random copolymer: DENKA CLEAREN (styrene content: 85 wt %)

C6 linear low density polyethylene: CARNEL KC570S manufactured by Nippon Polychem Ethylene-graft styrene polymer: MODIPER A1100 manufactured by NOF Corporation (ethylene content: 70 wt %)

Ethylene-ethyl acrylate: NUC 6221 manufactured by Nippon Unicar

Low density polyethylene: Petrothene 203 manufactured by TOSOH CORPORATION

High-impact polystyrene: DENKA HIE6 (styrene content: 92 wt %)

Ethylene-vinyl acetate copolymer: NUC3750 manufactured by Nippon Unicar

Examples 22 to 33 and Comparative Examples 7 to 18 relate to a container employing a vinylidene fluoride polymer and an acrylate type polymer. Measurements are carried out under the following conditions.

Static electrification charge amount: By using a nanocoulomb meter and a Faraday cage manufactured by ElectroTech system, static electrification charge amounts of an electronic component and a cylinder were measured.

Ionizer: AEROSTAT PC manufactured by SIMCO Japan was used.

Shaker: Cute Mixer manufactured by Tokyo Rika Kikai K.K. was used.

Example 22

75 Parts by weight of a vinylidene fluoride polymer (manufactured by KYNAR, tradename: 720) and 25 parts by weight of polymethyl methacrylate (manufactured by Mitsubishi Rayon Co., Ltd., tradename: ACRYPET G) as an acrylate type polymer were blended by means of a Henschel mixer, followed by fusion extrusion by means of a twin screw extruder manufactured by IKEGAI CORPORATION to prepare a compound. This compound was fusion-kneaded again by means of a single axial extruder to prepare a film having a thickness of 50 μm by means of a T-die. The film was attached to the slope with an angle of 30 degrees as shown in FIG. 2, and ionized air was blown on the film surface by using an ionizer to remove the film charge.

Figure 3:
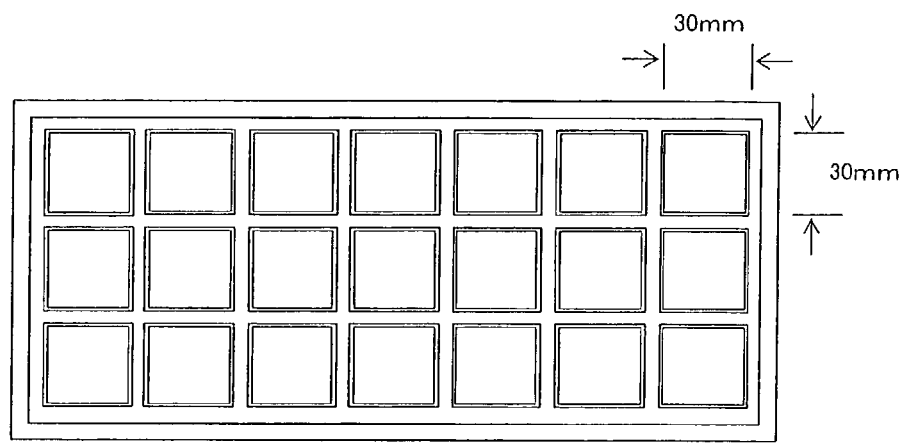

Then, the charge of an IC (MQFP type 28 mm square) to be an electronic component was removed by using an ionizer in the same manner, and the IC was slid down to measure the static electrification charge amount of the IC, whereupon it was 0.02 nC. Then, using a compound of said composition, a tray-form product for IC mounting as shown in FIG. 3 was prepared by injection molding. The IC was put on the tray, and rubbing was carried out by a shaker at a vibration rate of 600 times/min for a rubbing time of 30 seconds to measure the charge amount generated on the rubbed surface of the IC. The result is shown in Table 10, and the static electrification charge amount was so small as 0.23 nC.

Example 23

A compound comprising 75 parts by weight of a vinylidene fluoride polymer (manufactured by KYNAR, tradename: 720) and 25 parts by weight of polymethyl methacrylate (manufactured by Mitsubishi Rayon Co., Ltd., tradename: ACRYPET G) as an acrylate type polymer, and polyethylene terephthalate (manufactured by UNITIKA LTD.) were extruded by an extruder, and lamination was carried out by means of a feed block method to prepare a double-layer film having a thickness of 0.5 mm comprising a blended product of vinylidene fluoride with methyl methacrylate and polyethylene terephthalate.

Two sheets of such films were overlaid one on the other so that the sides of the blended product of vinylidene fluoride with polymethyl methacrylate faced each other, and three edges were heat-sealed to prepare a bag-form product. In the bag, one IC (MQFP, 28 mm square) was put, and rubbing was carried out by a shaker at a vibration rate of 600 times/min at a rubbing time of 30 seconds for 300 times, and the charge amount generated on the IC was measured. The result is shown in Table 10, and the static electrification charge amount was so small as 0.15 nC.

Example 24

30 Parts by weight of a vinylidene fluoride polymer (manufactured by KYNAR, tradename, 720) and 70 parts by weight of polymethyl methacrylate (manufactured by Mitsubishi Rayon Co., Ltd., ACRYPET G) as an acrylate type polymer were fusion-kneaded in the same manner as in Example 22 to prepare a compound, which was fused again and extruded from a T-die to prepare a film having a thickness of 50 μm. The film was attached to a slope with an angle of 20 degrees as shown in FIG. 1, and ionized air was blown to the film surface by using an ionizer to remove the film charge.

Figure 4:
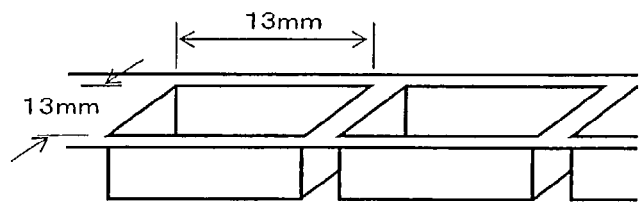

Then, a Teflon-made cylinder (φ25 mm×25 mm height), the charge of which was removed by using an ionizer in the same manner, was rolled down from the upper part of the slope, and the charge amount generated on the Teflon cylinder was measured, whereupon it was −0.35 nC. A sheet having a thickness of 0.3 mm made of polystyrene was prepared in the same manner and said sheet was attached to the slope, the Teflon-made cylinder, the charge of which was removed by using an ionizer, was rolled down from the upper part of the slope, and the charge amount generated on the Teflon cylinder was measured, whereupon it was −0.33 nC. The resin obtained by mixing a vinylidene fluoride polymer and polymethyl methacrylate was extruded to prepare a sheet having a thickness of 0.5 mm, followed by press forming to prepare a carrier tape-form product as shown in FIG. 4. In a pocket of the carrier tape, a polystyrene resin (in a size of 10 mm×10 mm×3 mm) was put, and rubbing was carried out by a shaker at a vibration rate of 600 times/min for a rubbing time of 30 seconds for 300 times, and the charge amount generated on the contained polystyrene was measured. The result is shown in Table 10. The static electrification charge amount was so small as −0.34 nC.

Example 25

70 Parts by weight of a vinylidene fluoride polymer (manufactured by KYNAR, tradename, 720) and 30 parts by weight of polymethyl methacrylate (manufactured by Mitsubishi Rayon Co., Ltd., ACRYPET G) as an acrylate type polymer were fusion-kneaded in the same manner as in Example 22 to prepare a compound, which was fused again and extruded from a T-die to prepare a film having a thickness of 50 μm. The film was attached to a slope with an angle of 20 degrees as shown in FIG. 1, and ionized air was blown to the film surface by using an ionizer to remove the film charge. Then, a Teflon-made cylinder (φ25 mm×25 mm height), the charge of which was removed by using an ionizer in the same manner, was rolled down from the upper part of the slope, and the charge amount generated on the Teflon cylinder was measured, whereupon it was −0.14 nC.

On the other hand, by using a purchased sheet having a thickness of 2 mm made of polyvinyl chloride, said sheet was attached to the slope, the Teflon-made cylinder, the charge of which was removed by using an ionizer, was rolled down from the upper part of the slope, and the charge amount generated on the Teflon cylinder was measured, whereupon it was −0.12 nC. The resin obtained by mixing a vinylidene fluoride polymer and polymethyl methacrylate was extruded to prepare a sheet having a thickness of 0.5 mm, followed by press forming to prepare a carrier tape-form product as shown in FIG. 4. In a pocket of the carrier tape, a polyvinyl chloride resin (in a size of 10 mm×10 mm×2 mm) was put, and rubbing was carried out by a shaker at a vibration rate of 600 times/min for a rubbing time of 30 seconds for 300 times, and the charge amount generated on the contained polyvinyl chloride resin was measured. The result is shown in Table 10. The static electrification charge amount was so small as −0.30 nC.

Comparative Example 7

For a comparison with Example 22, using a vinylidene fluoride polymer (manufactured by KYNAR, tradename: 720) as a resin material, a tray-form product as shown in FIG. 3 in the same manner as in Example 22 was prepared by injection molding. Rubbing was carried out by a shaker at a vibration rate of 600 times/min for a rubbing time of 30 seconds, and the charge amount generated on the IC was measured. The result is shown in Table 11, and the static electrification charge amount was so large as 1.53 nC.

Comparative Example 8

For a comparison with Example 22, using a methyl methacrylate resin (manufactured by Mitsubishi Rayon Co., Ltd., tradename: ACRYPET G) as a resin material, a tray in the same manner as in Example 22 was prepared by injection molding. Rubbing was carried out by a shaker at a vibration rate of 600 times/min for a rubbing time of 30 seconds, and the charge amount generated on the IC was measured. The result is shown in Table 11, and the static electrification charge amount was so large as −2.06 nC.

Comparative Example 9

For a comparison with Example 23, a polyethylene resin (manufactured by Nippon Polychem, tradename: NOVATEC) and polyethylene terephthalate (manufactured by UNITIKA LTD.) were co-extruded from two extruders to prepare a double-layer film having a thickness of 50 μm by a feed block method. Two sheets of such films were overlaid one on the other so that the polyethylene sides faced each other, and three edges were heat-sealed to prepare a bag-form product. An IC was put into this bag and rubbing was carried out in the same manner as in Example 23 to measure the charge amount generated on the IC. The result is shown in Table 11, and the static electrification charge amount was so large as 1.21 nC.

Comparative Example 10

For a comparison with Example 23, a random copolymer resin of methyl methacrylate with styrene (manufactured by Denki Kagaku Kogyo K.K., tradename: TX) and polyethylene terephthalate (manufactured by UNITIKA LTD.) were co-extruded from two extruders to prepare a double-layer film having a thickness of 50 μm by a feed block method. Two sheets of such films were overlaid one on the other so that the sides of the random copolymer resin of methyl methacrylate with polystyrene faced each other, and three edges were heat-sealed to prepare a bag-form product. An IC was put into this bag and rubbing was carried out in the same manner as in Example 23 to measure the charge amount on the IC. The result is shown in Table 11, and the static electrification charge amount was so large as −1.49 nC.

Comparative Example 11

For a comparison with Example 24, a polypropylene resin (manufactured by SUN-ALLOMER) was extruded to prepare a sheet having a thickness of 0.5 mm, and a carrier tape-form product as shown in FIG. 4 was prepared by a press molding method. In a pocket of the carrier tape, a polystyrene molded product (in a size of 10 mm×10 mm×3 mm) was put, and rubbing was carried out in the same manner as in Example 24 to measure the charge amount generated on the contained polystyrene. The result is shown in Table 11, and the static electrification charge amount was so large as 1.72 nC.

Comparative Example 12

For a comparison with Example 24, a polyethylene terephthalate resin (manufactured by UNITIKA LTD.) was extruded to prepare a sheet having a thickness of 0.5 mm, and a carrier tape-form product as shown in FIG. 4 was prepared by a press molding method. In a pocket of the carrier tape, a polystyrene resin molded product (in a size of 10 mm×10 mm×3 mm) was put, and rubbing was carried out in the same manner as in Example 24 to measure the charge amount generated on the contained polystyrene. The result is shown in Table 11, and the static electrification charge amount was so large as −1.24 nC.

Comparative Example 13

For a comparison with Example 25, a polypropylene resin (manufactured by SUN-ALLOMER) was extruded to prepare a sheet having a thickness of 0.5 mm, and a carrier tape-form product as shown in FIG. 4 was prepared by a press molding method. In a pocket of the carrier tape, a polyvinyl chloride molded product (in a size of 10 mm×10 mm×2 mm) was put, and rubbing was carried out in the same manner as in Example 25 to measure the charge amount generated on the contained polyvinyl chloride. The result is shown in Table 11, and the static electrification charge amount was so large as −1.41 nC.

Comparative Example 14

For a comparison with Example 25, a polyethylene terephthalate resin (manufactured by UNITIKA LTD.) was extruded to prepare a sheet having a thickness of 0.5 mm, and a carrier tape-form product as shown in FIG. 4 was prepared by a press molding method. In a pocket of the carrier tape, a polyvinyl chloride resin molded product (in a size of 10 mm×10 mm×2 mm) was put, and rubbing was carried out in the same manner as in Example 24 to measure the charge amount generated on the contained polyvinyl chloride. The result is shown in Table 11, and the static electrification charge amount was so large as −2.29 nC.

TABLE 10

| | Packaging container form | Packaging container resin | Component contained | Static electrification amount |
|---|---|---|---|---|
| Example 22 | Tray | PVDF:75 PMMA:25 | IC | 0.23 nC |
| Example 23 | Bag | PVDF:75 PMMA:25 | IC | 0.15 nC |
| Example 24 | Carrier tape | PVDF:30 PMMA:70 | Polystyrene | −0.34 nC |
| Example 25 | Carrier tape | PVDF:70 PMMA:30 | Polyvinyl chloride | 0.30 nC |

TABLE 10

| | Packaging container form | Packaging container resin | Component contained | Static electrification amount |
|---|---|---|---|---|
| Comparative Example 7 | Tray | PVDF: 100 | I C | 1.53 nC |
| Comparative Example 8 | Tray | PMMA: 100 | I C | 2.06 nC |
| Comparative Example 9 | Bag | PE: 100 | I C | 1.21 nC |
| Comparative Example 10 | Bag | MMA-St copolymer resin: 100 | I C | −1.49 nC |
| Comparative Example 11 | Carrier tape | PP: 100 | Polystyrene | 1.72 nC |
| Comparative Example 12 | Carrier tape | PET: 100 | Polystyrene | −1.24 nC |

TABLE 10-continued

|  | Packaging container form | Packaging container resin | Component contained | Static electrification amount |
|---|---|---|---|---|
| Comparative Example 13 | Carrier tape | PP: 100 | Polyvinyl chloride | −1.41 nC |
| Comparative Example 14 | Carrier tape | PET: 100 | Polyvinyl chloride | −2.29 nC |

It is found that in Examples 22 to 25 and Comparative Examples 7 to 14, by using a blended product of a vinylidene fluoride polymer with an acrylate type polymer for the inside surface of the packaging container with which the electronic component is in contact, and adjusting the blend ratio in order that the blended product matched with the series of frictional electrification of the electronic component, the static electrification amount generated on the surface of the component by contact or rubbing between the packaging container and the electronic component can be decreased.

Examples 26 to 33 and Comparative Examples 15 to 18 relate to a resin with a small amount of frictional static electrification. Measurement of the surface resistivity was carried out under the following condition.

Surface resistivity: A silver paste manufactured by FUJIKURAKASEI CO., LTD. was coated on the surface of a molded product with a space of 30 mm, and the resistivity between the silver pastes was measured by means of R8340 ULTRA HIGH RESISTANCE METER manufactured by ADVANTEST CORPORATION.

Example 26

20 Parts by weight of polymethyl methacrylate (manufactured by Mitsubishi Rayon Co., Ltd., tradename: ACRYPET MD) as an acrylate type polymer, 80 parts by weight of polystyrene (manufactured by Toyo Styrene K.K., tradename: TOYO STYROL MW-2) as a styrene type polymer and 22 parts by weight of carbon black (manufactured by Denki Kagaku Kogyo K.K., tradename: DENKA ACETYLENEBLACK particulate) as an electrical conductivity-imparting agent were blended by a tumbler mixer, and extruded by fusion-kneading with a $\phi$45 mm co-rotating twin screw extruder manufactured by IKEGAI CORPORATION to prepare a compound. A rubbing test specimen as shown in FIG. 5 was prepared by using this compound by an injection molder. On this molded product, an IC (manufactured by NEC Corporation, V25 microprocessor 28 mm square) destaticized by using an ionizer as an electronic component was put, and rubbing at a rate of 600 revolutions/min for 5 minutes was carried out on a cute mixer. After completion of the rubbing, the IC was grabbed with tweezers and introduced into a Faraday cage to measure the charge amount generated on the IC. The result is shown in Table 12, and the static electrification charge amount was so small as 0.25 nC.

Example 27

On the molded product of Example 26, an IC (manufactured by Texas Instruments Incorporated, TMS320C32PCM40 MPU micro controller 28 mm square) destaticized with an ionizer was put as an electronic component, and rubbing was carried out at a rate of 600 revolutions/min for 5 minutes on a cute mixer. After completion of the rubbing, the IC was grabbed with tweezers and introduced into a Faraday cage to measure the charge amount generated on the IC. The result is shown in Table 12, and the static electrification charge amount was so small as 0.34 nC.

Example 28

On the molded product of Example 26, an IC (manufactured by Hitachi Ltd., HD6475368CP10 MPU micro controller 28 mm square) destaticized with an ionizer was put as an electronic component, and rubbing was carried out at a rate of 600 revolutions/min for 5 minutes on a cute mixer. After completion of the rubbing, the IC was grabbed with tweezers and introduced into a Faraday cage to measure the charge amount generated on the IC. The result is shown in Table 12, and the static electrification charge amount was so small as 0.31 nC.

Example 29

40 Parts by weight of polymethyl methacrylate (manufactured by Mitsubishi Rayon Co., Ltd., tradename: ACRYPET MD) as an acrylate type polymer, 60 parts by weight of polystyrene (manufactured by Toyo Styrene, tradename: TOYO STYROL MW-2) as a styrene type polymer and 22 parts by weight of carbon black (manufactured by Denki Kagaku Kogyo K.K., tradename: DENKA ACETYLENE-BLACK particulate) as an electrical conductivity-imparting agent were blended by a tumbler mixer, and extruded by fusion-kneading with a $\phi$45 mm co-rotating twin screw extruder manufactured by IKEGAI CORPORATION to prepare a compound. A rubbing test specimen as shown in FIG. 5 was prepared by using this compound by an injection molder.

On this molded product, an IC (manufactured by NEC Corporation, V25 microprocessor 28 mm square) destaticized by using an ionizer as an electronic component was put, and rubbing at a rate of 600 revolutions/min for 5 minutes was carried out on a cute mixer. After completion of the rubbing, the IC was grabbed with tweezers and introduced into a Faraday cage to measure the charge amount generated on the IC. The result is shown in Table 12, and the static electrification charge amount was so small as −0.33 nC.

Example 30

30 Parts by weight of a rubber-modified acryl resin (manufactured by Mitsubishi Rayon Co., Ltd., tradename: ACRYPET HBS000) as an acrylate type polymer, 70 parts by weight of high-impact polystyrene (manufactured by Toyo Styrene, tradename: TOYO STYROL H1-U2-301U) as a styrene type polymer and 22 parts by weight of carbon black (manufactured by Denki Kagaku Kogyo K.K., tradename: DENKA ACETYLENEBLACK particulate) as an electrical conductivity-imparting agent were blended by a tumbler mixer, and extruded by fusion-kneading with a $\phi$45 mm co-rotating twin screw extruder manufactured by IKEGAI CORPORATION to prepare a compound. A rubbing test specimen as shown in FIG. 5 was prepared by using this compound by an injection molder.

On this molded product, an IC (manufactured by NEC Corporation, V25 microprocessor 28 mm square) destaticized by using an ionizer as an electronic component was put, and rubbing at a rate of 600 revolutions/min for 5 minutes was carried out on a cute mixer. After completion of the rubbing, the IC was grabbed with tweezers and introduced into a Faraday cage to measure the charge amount generated on the IC. The result is shown in Table 13, and the static electrification charge amount was so small as −0.19 nC.

Example 31

30 Parts by weight of a rubber-modified acryl resin (manufactured by Mitsubishi Rayon Co., Ltd., tradename: ACRYPET HBS000) as an acrylate type polymer, 70 parts by weight of high-impact polystyrene (manufactured by Toyo Styrene, tradename: TOYO STYROL H1-U2-301U) as a styrene type polymer and 12 parts by weight of carbon fibers (manufactured by TOHO TENAX Co., Ltd., tradename: HTA-C6) as an electrical conductivity-imparting agent were blended by a tumbler mixer, and extruded by fusion-kneading with a φ45 mm co-rotating twin screw extruder manufactured by IKEGAI CORPORATION to prepare a compound. A rubbing test specimen as shown in FIG. 5 was prepared by using this compound by an injection molder.

On this molded product, an IC (manufactured by NEC Corporation, V25 microprocessor 28 mm square) destaticized by using an ionizer as an electronic component was put, and rubbing at a rate of 600 revolutions/min for 5 minutes was carried out on a cute mixer. After completion of the rubbing, the IC was grabbed with tweezers and introduced into a Faraday cage to measure the charge amount generated on the IC. The result is shown in Table 13, and the static electrification charge amount was so small as −0.54 nC.

Example 32

30 Parts by weight of a polymethyl methacrylate resin (manufactured by Mitsubishi Rayon Co., Ltd., tradename: ACRYPET MD) as an acrylate type polymer, 40 parts by weight of a polyphenylene ether resin (Iupiace YPX-100L, manufactured by Mitsubishi Engineering-Plastics Corporation), 30 parts by weight of high-impact polystyrene (manufactured by Toyo Styrene, tradename: TOYO STYROL H1-U2-301U) as a styrene type polymer and 22 parts by weight of carbon black (manufactured by Denki Kagaku Kogyo K.K., tradename: DENKA ACETYLENEBLACK particulate) as an electrical conductivity-imparting material were blended by a tumbler mixer, followed by extrusion by fusion-kneading by a φ45 mm co-rotating twin screw extruder manufactured by IKEGAI CORPORATION to prepare a compound.

A rubbing test specimen as shown in FIG. 5 was prepared by using this compound by an injection molder. On this molded product, an IC (manufactured by NEC Corporation, V25 microprocessor 28 mm square) destaticized by using an ionizer as an electronic component was put, and rubbing at a rate of 600 revolutions/min for 5 minutes was carried out on a cute mixer. After completion of the rubbing, the IC was grabbed with tweezers and introduced into a Faraday cage to measure the charge amount generated on the IC. The result is shown in Table 13, and the static electrification charge amount was so small as −0.51 nC.

Example 33

30 Parts by weight of a polymethyl methacrylate resin (manufactured by Mitsubishi Rayon Co., Ltd., tradename: ACRYPET MD) as an acrylate type polymer, 70 parts by weight of high-impact polystyrene (manufactured by Toyo Styrene, tradename: TOYO STYROL H1-U2-301U) as a styrene type polymer and 22 parts by weight of carbon black (manufactured by Denki Kagaku Kogyo K.K., tradename: DENKA ACETYLENEBLACK particulate) as an electrical conductivity-imparting material were blended by a tumbler mixer, followed by extrusion by fusion-kneading with a φ45 mm co-rotating twin screw extruder manufactured by IKEGAI CORPORATION to prepare a compound.

Figure 6:
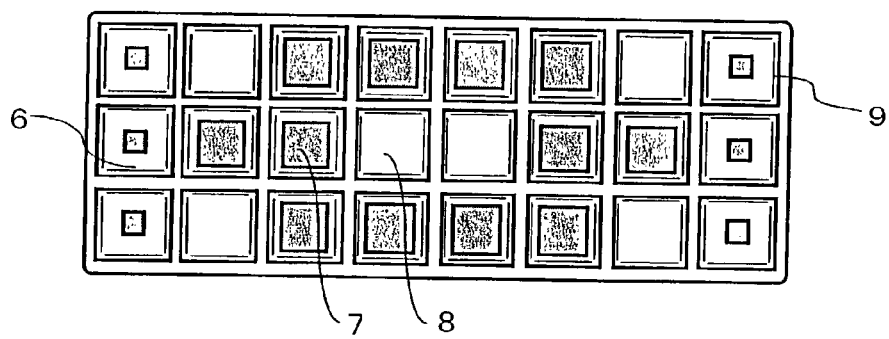
FIG. 6 illustrates an IC tray. Numerical reference 6 designates an IC pocket having a small hole on the bottom surface, used for a rubbing test. Numerical reference 7 designates an IC pocket having a large hole on the bottom surface, used for a rubbing test. Numerical reference 8 designates an IC pocket having no hole on the bottom surface, used for a rubbing test. Numerical reference 9 designates a microrib for IC fixation.

An IC tray as a container for an electronic component as shown in FIG. 6 was prepared by using this compound by an injection molder. In a pocket of this tray, an IC (manufactured by NEC Corporation, V25 micro processor 28 mm square) destaticized by an ionizer as an electronic component was put and lidded by using an another IC tray, and rubbing was carried out at a rate of 600 revolutions/min for 5 minutes on a cute mixer. Here, the space between microribs located at four edges of the IC pocket has an influence over the vibration width of the IC, and the space between the microribs was 28.3 mm. After completion of the rubbing, the IC was grabbed with tweezers and introduced into a Faraday cage to measure the charge amount generated on each IC. The results are shown in Table 13, and the static electrification charge amounts were within a range of from −0.24 to −0.82 nC, and the absolute value of the static electrification amount of the IC was small.

Comparative Example 15

For a comparison with Example 26, 100 parts by weight of high-impact polystyrene (manufactured by Toyo Styrene, tradename: TOYO STYROL H1-U2-301U) as a styrene type polymer and 22 parts by weight of carbon black (manufactured by Denki Kagaku Kogyo K.K., tradename: DENKA ACETYLENEBLACK particulate) as an electrical conductivity-imparting agent were blended by a tumbler mixer, and the frictional static electrification amount of the IC was measured in the same manner as in Example 26. The result is shown in Table 14, and the static electrification charge amount was 1.57 nC.

Comparative Example 16

For a comparison, 100 parts by weight of a low density polyethylene resin (manufactured by Nippon Polychem, tradename: NOVATEC LD) and 25 parts by weight of carbon black (manufactured by Denki Kagaku Kogyo K.K., tradename: DENKA ACETYLENEBLACK) as an electrical conductivity-imparting material were blended by a tumbler mixer, and the frictional static electrification amount of the IC was measured in the same manner as in Example 26. The result is shown in Table 14, and the static electrification charge amount was so large as 2.35 nC.

Comparative Example 17

For a comparison, 100 parts by weight of a high density polyethylene resin (manufactured by Nippon Polychem, tradename: NOVATEC HD) and 12 parts by weight of carbon fibers (manufactured by TOHO TENAX Co., Ltd., tradename: HTA-C6) as an electrical conductivity-imparting material were blended by a tumbler mixer, and the frictional static electrification amount of the IC was measured in the same manner as in Example 26. The result is shown in Table 14, and the static electrification charge amount was so large as 6.87 nC.

Comparative Example 18

For a comparison with Example 33, 80 parts by weight of a polystyrene resin (manufactured by Toyo Styrene, tradename: TOYO STYROL MW-2), 20 parts by weight of a block polymer of styrene with butadiene (manufactured by JSR Corporation, tradename: TR-2003) and 24 parts by weight of carbon black (manufactured by Denki Kagaku Kogyo K.K., tradename: DENKA ACETYLENEBLACK particulate) as an electrical conductivity-imparting agent were blended by a tumbler mixer, and an IC tray was formed in the same manner as in Example 33 to measure the frictional static electrification amount of the IC. The results are shown in Table 14, and the static electrification charge amounts were within a range of from 1.33 to 1.79 nC.

TABLE 12

|  | Example 26 | Example 27 | Example 28 | Example 29 |
|---|---|---|---|---|
| Acrylate type polymer | PMMA: 20 | PMMA: 20 | PMMA: 20 | PMMA: 40 |
| Styrene type polymer | PS: 80 | PS: 80 | PS: 80 | PS: 60 |
| Electrical conductivity-imparting agent | CB: 22 | CB: 22 | CB: 22 | CB: 22 |
| Resin molded product | Rubbing test specimen | Rubbing test specimen | Rubbing test specimen | Rubbing test specimen |
| Type of electronic component | IC·1 | IC·2 | IC·3 | IC·1 |
| Surface resistivity ($\Omega$) | $6.4 \times 10^5$ | $6.4 \times 10^5$ | $6.4 \times 10^5$ | $5.9 \times 10^5$ |
| Static electrification charge amount of electronic component (nC) | 0.25 | 0.34 | 0.31 | −0.33 |

Symbols in Tables 13 and 14 are as follows.
PMMA: Polymethyl methacrylate
PS: Polystyrene
HIPS: High-impact polystyrene
CB: Carbon black
IC•1: V25 microprocessor manufactured by NEC Corporation
IC•2: TMS320C32PCM40 MPU micro controller manufactured by Texas Instruments Incorporated
IC•3: HD6475368CP10 MPU micro controller manufactured by Hitachi Ltd.

In Example 33 of Table 13 and in Comparative Example 18 of Table 14, the static electrification amount of the IC was measured at three pockets in the tray of FIG. 6.

(1) Static electrification charge amount of the IC put in pocket 1 of FIG. 6
(2) Static electrification charge amount of the IC put in pocket 2 of FIG. 6
(3) Static electrification charge amount of the IC put in pocket 3 of FIG. 6

TABLE 13

|  | Example 30 | Example 31 | Example 32 | Example 33 |
|---|---|---|---|---|
| Acrylate type polymer | Rubber-modified acryl resin: 30 | Rubber-modified acryl resin: 30 | PMMA: 30 | PMMA: 30 |
| Styrene type polymer | HIPS: 70 | HIPS: 70 | HIPS: 30 | HIPS: 70 |
| Polyphenylene ether | — | — | 40 | — |
| Electrical conductivity-imparting agent | CB: 22 | Carbon fibers: 12 | CB: 22 | CB: 22 |

TABLE 13-continued

|  | Example 30 | Example 31 | Example 32 | Example 33 |
|---|---|---|---|---|
| Resin molded product | Rubbing test specimen | Rubbing test specimen | Rubbing test specimen | IC tray |
| Type of electronic component | IC·1 | IC·1 | IC·1 | IC·1 |
| Surface resistivity ($\Omega$) | $9.1 \times 10^4$ | $1.8 \times 10^3$ | $5.9 \times 10^4$ | $7.3 \times 10^4$ |
| Static electrification charge amount of electronic component (nC) | −0.19 | −0.54 | −0.51 | (1) −0.48 (2) −0.24 (3) −0.82 |

TABLE 14

|  | Comparative Example 15 | Comparative Example 16 | Comparative Example 17 | Comparative Example 18 |
|---|---|---|---|---|
| Acrylate type polymer | — | — | — | — |
| Styrene type polymer | HIPS: 100 | — | — | PS: 80 |
| Low-density polyethylene | — | 100 | — | — |
| High-density polyethylene | — | — | 100 | — |
| Styrene-butadiene block polymer | — | — | — | 20 |
| Electrical conductivity-imparting agent | CB: 22 | CB: 25 | Carbon fibers: 12 | CB: 24 |
| Resin molded product | Rubbing test specimen | Rubbing test specimen | Rubbing test specimen | IC tray |
| Type of electronic component | IC·1 | IC·1 | IC·1 | IC·1 |
| Surface resistivity ($\Omega$) | $1.5 \times 10^5$ | $1.5 \times 10^6$ | $3.7 \times 10^9$ | $3.2 \times 10^5$ |
| Static electrification charge amount of electronic component (nC) | 1.57 | 2.35 | 6.87 | (1)1.33 (2)1.63 (3)1.79 |

Examples 34 to 41 and Comparative Examples 19 to 24 relate to a container, the surface of which was roughened.

Examples 34 to 39

Using as a resin, a polyethylene type graft copolymer resin (manufactured by NOF corporation, tradename: MODIPER) as a material, the resin was extruded from a die having a width of 550 mm by means of φ40 mm single axis extruder manufactured by Tanabe Kikai, and pinched between a metal roll subjected to sandblast treatment and a silicon rubber roll to form a sheet having a thickness of 300 µm. At the time of sheet formation, the roughness of the sandblast was changed to prepare sheets having various surface roughnesses of Examples 34 to 39.

Then, each of these sheets was cut, heated and subjected to vacuum forming to form a carrier tape as shown in FIG. 3. As the surface roughness of this carrier tape, Ra and Rmax were measured by using a feeler type surface roughness measuring apparatus SURFCOM manufactured by TOKYO SEIMITSU CO., LTD. with a reference length of 2.5 mm. The carrier tape was bonded to a metal plate and sprayed with an ionized air for destaticization, then an IC (MQFP27×27) destaticized by ionized air as an electronic component was put in a pocket of the carrier tape, and the electronic component and the carrier tape were rubbed with each other with a rate of 300 back-and-forth motions per minute for 500 back-and-forth motions. At the time of rubbing, leads of the IC were cut and covered with an insulating tape so that the voltage generated in the package was accurately measured.

Then, the IC was taken up with tweezers made of an insulating polyacetal, and the frictional static electrification voltage generated at the rubbed surface was measured. As evident from the results shown in Table 15, substantially no increase in the static electrification voltage was observed by rubbing between the rubbing test specimen having a surface roughness and the IC. Here, for measurement of the static electrification voltage, static electrification voltage measuring apparatus SK-030 and SK-200, manufactured by KEYENCE CORPORATION were used.

Example 40

Using as a resin a polystyrene type resin (manufactured by Denki Kagaku Kogyo K.K. tradename: CLEAREN), a carrier tape was prepared in the same manner as in Example 34, and the surface roughness and the frictional static electrification amount were evaluated in the same manner as in Example 34. As evident from the results shown in Table 15, substantially no increase in the static electrification voltage was observed by rubbing between the rubbing test specimen made of CLEAREN and the IC.

Example 41

Using as a resin a polystyrene homopolymer (TOYO STYROL GP-1, manufactured by Toyo Styrene), a tray-like product as shown in FIG. 4 was formed by means of a 220t injection molder manufactured by TOSHIBA CORPORATION. At that time, the surface roughness of the surface of the mold was increased by sandblast treatment. Using said molded product, the frictional static electrification amount by rubbing with an IC was measured in the same manner as in Example 34. As evident from the results shown in Table 15, substantially no increase in the static electrification voltage was observed on the surface of the rubbed IC.

TABLE 15

| | Test specimen | Ra | Rmax | Static electrification voltage (kv) |
|---|---|---|---|---|
| Example 34 | PE type graft resin | 0.8 | 6.7 | 0.8 |
| Example 35 | PE type graft resin | 1.2 | 9.9 | 0.8 |
| Example 36 | PE type graft resin | 1.8 | 24.5 | 0.3 |
| Example 37 | PE type graft resin | 2.0 | 15.4 | −1.1 |
| Example 38 | PE type graft resin | 4.9 | 52.7 | 1.3 |
| Example 39 | PE type graft resin | 5.0 | 42.4 | 1.1 |
| Example 40 | PS resin | 1.1 | 7.7 | 0.0 |
| Example 41 | PS resin | 8.2 | 79.2 | 0.2 |

Comparative Examples 19 to 21

For a comparison with Examples 34 to 39, using as a resin a polyethylene type graft copolymer resin (manufactured by NOF CORPORATION, tradename: MODIPER) as a material, the resin was extruded from a dice having a width of 550 mm by means of a φ40 mm single axis extruder manufactured by Tanabe Kikai, and pinched between a metal gloss roll and a silicon rubber roll to form a sheet having a thickness of 300 μm. At the time of sheet formation, the roll temperature was changed to prepare sheets having surface roughnesses of Comparative Examples 19 to 21.

Then, each of these sheets was heated and subjected to vacuum forming to form a carrier tape-like product as shown in FIG. 3. Then, as the surface roughness of the carrier tape, Ra and Rmax were measured by means of a feeler type surface roughness measuring apparatus SURFCOM manufactured by TOKYO SEIMITSU CO., LTD. with a reference length of 2.5 mm, whereupon Ra was less than 0.5 μm and Rmax was less than 5 μm. Then, the IC and the carrier tape were rubbed with each other in the same manner as in Example 34. As evident from the results shown in Table 16, a static electrification voltage of several thousands volt was observed on the surface of the rubbed IC by rubbing between the rubbing test specimen having a surface roughness and the IC.

Comparative Example 22

For a comparison with Example 40, using a polystyrene type resin (manufactured by Denki Kagaku Kogyo K.K., tradename: CLEAREN) as a material, a sheet having a thickness of 300 μm was formed in the same manner as in Comparative Example 19 and a carrier tape-like product was prepared. Then, the rubbing test with an IC was carried out in the same manner as in Example 34. As evident from the results shown in Table 16, a static electrification voltage of several thousands volt was observed on the surface of the rubbed IC by rubbing between the rubbing test specimen having a surface roughness and the IC.

Comparative Example 23

For a comparison with Example 41, using as a resin a styrene homopolymer (TOYO STYROL GP-1, tradename, manufactured by Toyo Styrene), a tray-like product as shown in FIG. 4 was formed by means of a 220t injection molder manufactured by TOSHIBA CORPORATION. At that time, the surface of the mold was smoothened to decrease the surface roughness. Using the molded product, measurement of the frictional static electrification amount by rubbing with an IC was carried out in the same manner as in Example 34. As evident from the results shown in Table 16, a static electrification voltage of several thousands volt was observed on the surface of the rubbed IC.

Comparative Example 24

25 parts by weight of carbon black (manufactured by Denki Kagaku Kogyo K.K., tradename: DENKA ACETYLENE BLACK) was added to 100 parts by weight of a rubber-modified polystyrene (manufactured by Toyo Styrene, tradename: TOYO STYROL H1-U2-301U) as a resin, followed by mixing by a tumbler, then fusion kneading was carried out by means of a twin screw extruder PCM-45 manufactured by IKEGAI CORPORATION to prepare an electrically conductive compound. The electrically conductive compound was extruded by a subextruder (φ40 mm single axis extruder manufactured by Tanabe Kikai), on the other hand, a rubber-modified polystyrene (TOYO STYROL H1-U2-301U, manufactured by Toyo Styrene) and a styrene-butadiene copolymer resin (manufactured by JSR, tradename: TR-2000) in a weight ratio of 100:5 were mixed and extruded from a main extruder (φ40 mm single axis extruder), and a three-layer sheet having a thickness of 300 μm, comprising the electrically conductive compound as both surface layers and a non-electrically conductive rubber-modified polystyrene resin as the center layer, was prepared by means of a feed block method. At that time, a metal gloss roll and a silicon rubber roll were used as pinch rolls to obtain a three layer sheet having a small surface roughness. The surface resistivity of the sheet was measured by means of Loresta HP manufactured by Mitsubishi Chemical Corporation, whereupon it was $10^5 \, \Omega$.

Then, this sheet was heated and subjected to vacuum forming to form a carrier tape-like product as illustrated in FIG. 3. Then, a rubbing test with an IC was carried out in the same manner as in Example 34. As evident from the results shown in Table 16, a static electrification voltage of several thousands volt was observed on the surface of the rubbed IC by rubbing between the rubbing test specimen having a surface roughness and the IC.

TABLE 16

| Test specimen | | Ra | Rmax | Static electrification voltage (kv) |
|---|---|---|---|---|
| Comparative Example 19 | PE type graft resin | 0.25 | 3.2 | 8.0 |
| Comparative Example 20 | PE type graft resin | 0.26 | 2.2 | 8.7 |
| Comparative Example 21 | PE type graft resin | 0.30 | 3.0 | 8.2 |
| Comparative Example 22 | PS resin | 0.30 | 2.7 | 9.7 |
| Comparative Example 23 | PS resin | 0.11 | 1.2 | 7.6 |
| Comparative Example 24 | PS type three-layer sheet | 0.31 | 2.3 | 3.9 |

As evident from Examples, it is found that by increasing the surface roughness of the sheet for packaging an electronic component, static electrification voltage generated on the rubbed surface of an electronic component by rubbing between a packaging sheet and an electronic component contained therein or rubbing between an electronic component and an electronic component packaged product can be decreased.

INDUSTRIAL APPLICABILITY

According to the present invention, by using a specific resin for the inside surface of a packaging container to be in contact with an electronic component contained therein, such as a cover tape or a bottom tape, the absolute value of the static electrification amount generated on the surface of an electronic component due to contact or rubbing with the cover tape or the bottom tape can be decreased. Further, by roughening the surface to be in contact with an electronic component, static electricity to be generated by conduct between an electronic component and the container can be decreased. Accordingly, impairment of an electronic component due to static electricity can be controlled. As attachment of a component to the packaging container can be prevented, workability at the time of mounting a component on a substrate will not decrease. Further, static electricity destruction of an electronic component sensitive to static electricity can be prevented.

The entire disclosures of Japanese Patent Application No. 2001-158455 filed on May 28, 2001, Japanese Patent Application No. 2001-207442 filed on Jul. 9, 2001, Japanese Patent Application No. 2001-317981 filed on Oct. 16, 2001 and Japanese Patent Application No. 2002-91019 filed on Mar. 28, 2002 including specifications, claims, drawings and summaries are incorporated herein by reference in their entireties.

The invention claimed is:

1. A carrier tape body comprising an embossed tape continuously having pockets for containing an electronic component sealed with a cover tape,
    wherein when the cover tape is peeled off with a peeling angle of from 170 to 180 degrees at a peeling rate of 300 mm/min in a peeling amount of 112 mm:
    (a) the peeling static electrification amount of the cover tape is from −9 to +9 nC when the cover tape has a surface resistivity of at least $10^{11} \, \Omega$ and
    (b) the peeling static electrification amount of the cover tape is from −3 to +3 nC when the cover tape has a surface resistivity of less than $10^{11} \, \Omega$,
    wherein the embossed tape comprises a styrene type polymer selected from the group consisting of polystyrene, styrene-butadiene copolymer, hydrogenated adduct of styrene-butadiene copolymer, styrene-butadiene random copolymer, styrene-butadiene block copolymer, styrene-isoprene copolymer, styrene-maleic anhydride copolymer, high-impact polystyrene, and a copolymer comprising a styrene derivative and a conjugated diene group,
    wherein the embossed tape also comprises a polycarbonate selected from the group consisting of a bisphenol A type polycarbonate comprising an aliphatic carbonate, a mixture comprising the bisphenol A type polycarbonate and less than 50 wt % of polyethylene terephthalate, and a mixture comprising the bisphenol A type polycarbonate and less than 50 wt % polybutylene terephthalate,
    wherein the cover tape comprises a styrene type copolymer, wherein the styrene type copolymer is a copolymer of a styrene type monomer with a conjugated diene type monomer or a high-impact polystyrene, wherein the styrene type monomer is selected from the group consisting of o-methylstyrene, p-methylstyrene, p-tert-butylstyrene, and α-methylstyrene, and wherein the conjugated diene type monomer is selected from the group consisting of 1,3-butadiene, 1,3-pentadiene, 1,3-hexadiene, and 2-methylpentadiene, and
    wherein the cover tape also comprises an ethylene type copolymer selected from the group consisting of an ethylene-1-butene copolymer, ethylene-vinyl acetate copolymer, ethylene-butyl acrylate, ethylene-styrene copolymer, an ethylene-maleic anhydride-acrylate copolymer, and mixtures thereof,
    wherein the embossed tape has a part which faces the cover tape, wherein the part of the embossed tape which faces the cover tape comprises at least one polymer selected from the group consisting of a styrene type polymer, a polycarbonate, a polyester and an ethylene type copolymer, and
    wherein the cover tape has a part which faces the embossed tape, wherein the part of the cover tape which faces the embossed tape comprises a styrene type copolymer and/or ethylene type copolymer.

2. The carrier tape body according to claim 1, wherein the peeling static electrification voltage of the cover tape when the cover tape is peeled off is from −1.9 to +1.9 kV when the tape has a surface resistivity of at least $10^{11}$ Ω, and the peeling static electrification voltage of the cover tape when the cover tape is peeled off is from −0.2 to +0.2 kV when the cover tape has a surface resistivity of less than $10^{11}$ Ω.

3. The carrier tape body according to claim 1, wherein the cover tape comprises a thermoplastic resin.

4. The carrier tape body according to claim 1, wherein the embossed tape comprises carbon black, inorganic filler, an electrically conductive coating, or an electrically conductive polymer having an inorganic filler dispersed therein.

5. The carrier tape body according to claim 1, wherein the embossed tape or the cover tape comprises an antistatic agent.

6. The carrier tape body according to claim 5, wherein the antistatic agent is selected from the group consisting of a nonionic type antistatic agent, an anion type antistatic agent, a cation type antistatic agent, an amphoteric ion type antistatic agent, a polymer type antistatic agent, and mixtures thereof.

7. The carrier tape body according to claim 1, wherein the embossed tape comprises polyethylene terephthalate.

8. The carrier tape body according to claim 1, wherein the cover tape further comprises a resin which is capable of being positively charged and a resin which is capable of being negatively charged.

9. The carrier tape body according to claim 1, wherein the resin which is capable of being positively charged comprises a styrene type polymer, a polycarbonate, or an acryl type resin, and the resin which is capable of being negatively charged comprises a polyethylene type resin or a polyvinyl chloride resin.

* * * * *

UNITED STATES PATENT AND TRADEMARK OFFICE
CERTIFICATE OF CORRECTION

PATENT NO. : 7,455,896 B2  Page 1 of 1
APPLICATION NO. : 10/296937
DATED : November 25, 2008
INVENTOR(S) : Fujimura et al.

It is certified that error appears in the above-identified patent and that said Letters Patent is hereby corrected as shown below:

On the title page, Item (75), the Inventors' information is incorrect. Item (75) should read:

--(75) Inventors: Tetsuo Fujimura, Isezaki (JP); Takeshi Miyakawa, Isezaki (JP); Mikio Shimizu, Isezaki (JP); Satoshi Yokoyama, Isezaki (JP); Masanori Higano, Isezaki (JP); Masanori Ishii, Isezaki (JP); Kazuhiro Kosugi, Isezaki (JP); Takashi Tomizawa, Isezaki (JP)--

On the title page, Item (30), the Foreign Application Priority Data is incorrect. Item (30) should read:

--(30) Foreign Application Priority Data

| | | |
|---|---|---|
| May 28, 2001 | (JP) | 2001-158455 |
| Jul. 9, 2001 | (JP) | 2001-207442 |
| Oct. 16, 2001 | (JP) | 2001-317981 |
| Mar. 28, 2002 | (JP) | 2001-91019-- |

Signed and Sealed this

Third Day of February, 2009

JOHN DOLL
*Acting Director of the United States Patent and Trademark Office*